(12) United States Patent
Sasaki et al.

(10) Patent No.: US 9,564,474 B2
(45) Date of Patent: Feb. 7, 2017

(54) TFT SUBSTRATE, METHOD FOR PRODUCING SAME, ORGANIC EL DISPLAY DEVICE, AND METHOD FOR MANUFACTURING ORGANIC EL DISPLAY DEVICE

(71) Applicant: JOLED INC., Tokyo (JP)

(72) Inventors: Atsushi Sasaki, Hyogo (JP); Eiichi Satoh, Hyogo (JP); Hirofumi Higashi, Hyogo (JP)

(73) Assignee: JOLED INC., Tokyo (JP)

( * ) Notice: Subject to any disclaimer, the term of this patent is extended or adjusted under 35 U.S.C. 154(b) by 106 days.

(21) Appl. No.: 14/391,843

(22) PCT Filed: Jun. 19, 2013

(86) PCT No.: PCT/JP2013/003823
§ 371 (c)(1),
(2) Date: Oct. 10, 2014

(87) PCT Pub. No.: WO2013/190838
PCT Pub. Date: Dec. 27, 2013

(65) Prior Publication Data
US 2015/0076467 A1    Mar. 19, 2015

(30) Foreign Application Priority Data

Jun. 21, 2012   (JP) .................................. 2012-139313
Oct. 1, 2012    (JP) .................................. 2012-219112

(51) Int. Cl.
*H01L 29/04* (2006.01)
*H01L 27/32* (2006.01)
(Continued)

(52) U.S. Cl.
CPC ...... *H01L 27/3244* (2013.01); *H01L 21/31111* (2013.01); *H01L 21/31116* (2013.01);
(Continued)

(58) Field of Classification Search
CPC .................... H01L 21/76802; H01L 21/76804
See application file for complete search history.

(56) References Cited

U.S. PATENT DOCUMENTS 5,384,287 A    1/1995   Fukase
5,940,732 A    8/1999   Zhang
(Continued)

FOREIGN PATENT DOCUMENTS

JP    02-273922    11/1990
JP    05-218211    8/1993
(Continued)

OTHER PUBLICATIONS

U.S. Appl. No. 14/401,599 to Hirofumi Higashi et al., which was filed Nov. 17, 2014.
(Continued)

*Primary Examiner* — Samuel Gebremariam
(74) *Attorney, Agent, or Firm* — Greenblum & Bernstein, P.L.C.

(57) ABSTRACT

A method of manufacturing a thin film transistor (TFT) substrate in which a TFT including an oxide semiconductor layer is formed, the method including: forming an insulating layer to cover the oxide semiconductor layer; and forming an opening in the insulating layer, wherein the insulating layer includes a first film, a second film which is provided above the first film and is an aluminum oxide film, and a third film which is provided above the second film and is a film including silicon, and the forming of an opening includes: forming a resist pattern above the third film; processing the third film by dry etching; and processing the second film by wet etching.

15 Claims, 25 Drawing Sheets

(51) Int. Cl.
- *H01L 21/311* (2006.01)
- *H01L 27/12* (2006.01)
- *H01L 29/786* (2006.01)
- *H01L 29/66* (2006.01)
- *H01L 51/52* (2006.01)

(52) U.S. Cl.
CPC .... *H01L 21/31144* (2013.01); *H01L 27/1225* (2013.01); *H01L 27/1288* (2013.01); *H01L 29/66765* (2013.01); *H01L 29/66969* (2013.01); *H01L 29/7869* (2013.01); *H01L 29/78606* (2013.01); *H01L 29/78693* (2013.01); *H01L 51/5212* (2013.01); *H01L 2227/323* (2013.01)

(56) References Cited

U.S. PATENT DOCUMENTS

| | | | |
|---|---|---|---|
| 6,396,078 | B1 | 5/2002 | Uochi et al. |
| 6,593,235 | B2 | 7/2003 | Uochi et al. |
| 7,786,553 | B1 | 8/2010 | Zhang |
| 7,800,235 | B2 | 9/2010 | Zhang |
| 8,241,980 | B2 | 8/2012 | Miyazaki et al. |
| 8,283,788 | B2 | 10/2012 | Zhang |
| 8,330,150 | B2 | 12/2012 | Chung et al. |
| 8,395,316 | B2 | 3/2013 | Nagayama et al. |
| 8,426,851 | B2 | 4/2013 | Morosawa et al. |
| 8,466,021 | B2 | 6/2013 | Miyazaki et al. |
| 8,546,175 | B2 | 10/2013 | Chung et al. |
| 8,659,014 | B2 * | 2/2014 | Honda ............. H01L 27/1225 257/43 |
| 9,105,862 | B2 | 8/2015 | Chung et al. |
| 9,178,072 | B2 | 11/2015 | Morosawa et al. |
| 9,373,669 | B2 | 6/2016 | Chung et al. |
| 2002/0113239 | A1 | 8/2002 | Uochi et al. |
| 2005/0287722 | A1 | 12/2005 | Zhang |
| 2010/0001372 | A1 | 1/2010 | Miyazaki et al. |
| 2010/0193772 | A1 | 8/2010 | Morosawa et al. |
| 2011/0001192 | A1 | 1/2011 | Zhang |
| 2011/0095274 | A1 | 4/2011 | Chung et al. |
| 2011/0121753 | A1 | 5/2011 | Nagayama et al. |
| 2011/0297930 | A1 | 12/2011 | Choi et al. |
| 2012/0168880 | A1 | 7/2012 | Zhang |
| 2012/0288965 | A1 | 11/2012 | Miyazaki et al. |
| 2013/0056728 | A1 | 3/2013 | Morosawa et al. |
| 2013/0109119 | A1 | 5/2013 | Chung et al. |
| 2013/0341614 | A1 | 12/2013 | Chung et al. |
| 2015/0340417 | A1 | 11/2015 | Chung et al. |

FOREIGN PATENT DOCUMENTS

| | | |
|---|---|---|
| JP | 07-335756 | 12/1995 |
| JP | 09-102481 | 4/1997 |
| JP | 09-213968 | 8/1997 |
| JP | 09-232585 | 9/1997 |
| JP | 09-251996 | 9/1997 |
| JP | 2001-156326 | 6/2001 |
| JP | 2009-289919 | 12/2009 |
| JP | 2010-027584 | 2/2010 |
| JP | 2010-182819 | 8/2010 |
| JP | 2011-097022 | 5/2011 |
| JP | 2011-103341 | 5/2011 |
| JP | 2011-258949 | 12/2011 |
| WO | 2008/117426 | 10/2008 |

OTHER PUBLICATIONS

International Search Report (ISR) in International Patent Application No. PCT/JP2013/003823, dated Aug. 20, 2013.

Office Action from Japan Patent Office (JPO) in Japanese Patent Appl. No. 2014-520954, dated Aug. 16, 2016.

* cited by examiner

TFT SUBSTRATE, METHOD FOR PRODUCING SAME, ORGANIC EL DISPLAY DEVICE, AND METHOD FOR MANUFACTURING ORGANIC EL DISPLAY DEVICE

TECHNICAL FIELD

A technique disclosed here relates to a thin film transistor (TFT) substrate and a method of manufacturing a TFT substrate, and to an organic electroluminescence (EL) display device driven by a TFT and a method of manufacturing an organic EL display device.

BACKGROUND ART

An organic EL display device of an active-matrix type using a TFT substrate is known (for example, see patent literature (PTL) 1).

CITATION LIST

Patent Literature

[PTL 1]
Japanese Unexamined Patent Application Publication No. 2010-27584

SUMMARY OF INVENTION

Technical Problem

Provision of a TFT substrate having a desired property is difficult with a conventional technique, which is problematic.

Solution to Problem

An aspect of a first method of manufacturing a thin film transistor (TFT) substrate which solves the above-described problem is a method of manufacturing a TFT substrate in which a TFT including an oxide semiconductor layer is formed, the method including: forming an insulating layer to cover the oxide semiconductor layer; and forming an opening in the insulating layer, wherein the insulating layer includes a first film, a second film which is provided above the first film and is an aluminum oxide film, and a third film which is provided above the second film and is a film including silicon, and the forming of an opening includes: forming a resist pattern above the third film; processing the third film by dry etching; and processing the second film by wet etching.

Furthermore, an aspect of a thin film transistor (TFT) substrate which solves the above-described problem includes: an insulating layer having an opening; and an electrode which is continuously provided in the opening and above the insulating layer, wherein the insulating layer includes a first film, a second film above the first film, and a third film above the second film, and the opening has a downward tapered shape at least in a cross section of the third film.

Furthermore, an aspect of a second method of manufacturing a TFT substrate which solves the above-described problem includes: forming an insulating layer; forming an opening in the insulating layer; and continuously forming an electrode in the opening and above the insulating layer, wherein the forming of an insulating layer includes: forming a first film; forming a second film above the first film; and forming a third film above the second film, the forming of an opening includes: forming a resist pattern above the third film; processing the third film by dry etching; processing the second film by wet etching; and processing the first film by dry etching, and in the processing of the third film, the opening is formed to have a downward tapered shape in a cross section of the third film.

Advantageous Effects of Invention

A TFT substrate having a desired property can be provided.

Figure 1:
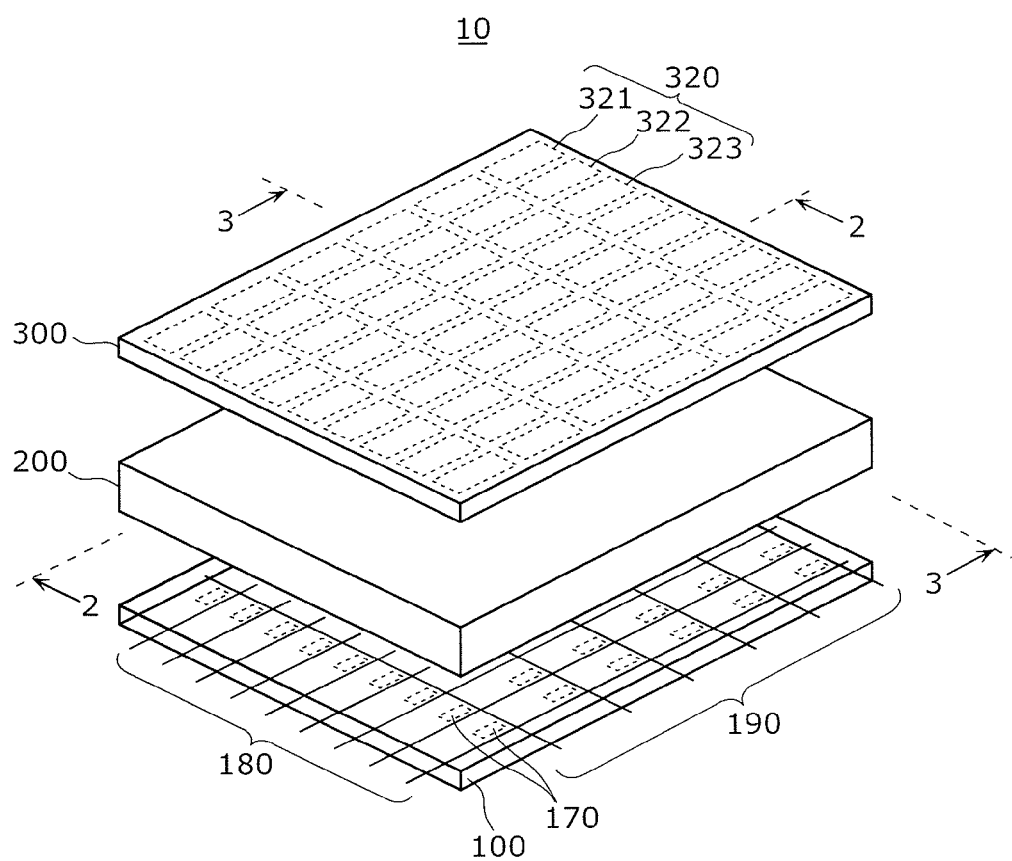
FIG. 1 is an exploded perspective view showing a schematic configuration of an organic EL display device according to Embodiment 1.

DESCRIPTION OF EMBODIMENTS (Underlying Knowledge Forming Basis of the Present Disclosure)

A TFT substrate includes an electrode which is electrically connected, via an opening provided in an insulating layer, to a layer provided below the insulating layer.

In particular, in the case of a TFT substrate including a TFT in which a channel layer is an oxide semiconductor layer, an aluminum oxide film (alumina film) is sometimes used as an insulating layer which covers the TFT to reduce diffusion of hydrogen and oxygen to an oxide semiconductor layer. For example, there is a case where an insulating layer having a three-layer structure of a silicon oxide film, an aluminum oxide film, and a silicon oxide film is formed to cover the oxide semiconductor layer. The insulating layer serves as an insulating layer between an oxide semiconductor layer and the electrode and also as an etch-stop layer for the oxide semiconductor layer. In this case, an opening is formed in the insulating layer for conduction between the electrode and the oxide semiconductor layer.

When forming the opening in the insulating layer, the aluminum oxide film of the insulating layer is processed by wet etching or dry etching.

When the aluminum oxide film is processed by wet etching, an example of a wet etching solution is an alkaline solution having a high etching rate. However, the alkaline solution has an effect of stripping a resist pattern (resist film). Thus, when the aluminum oxide film is processed with a resist pattern directly provided on the aluminum oxide film, there is concern that an alkaline solution at the time of wet etching causes stripping or the like of the resist pattern to impair a function of the resist pattern as a mask. Consequently, the aluminum oxide film may not be processed into a desired shape. Thus, it has been difficult to use an alkaline solution as a wet etching solution for processing the aluminum oxide film. In other words, throughput is low when the insulating layer is processed, which is problematic.

On the other hand, a method in which the aluminum oxide film is processed by dry etching is not suitable for a mass production because an etching selectivity ratio with respect to a lower layer is hard to maintain. For example, in the case where the insulating layer has a three-layer structure of a silicon oxide film, an aluminum oxide film, and a silicon oxide film, the etching selectivity ratio is hard to maintain between the aluminum oxide film and a lower layer that is the silicon oxide film.

The present disclosure is conceived in view of the aforementioned problems and has as a first object to provide a TFT substrate and a method of manufacturing the TFT substrate which can reduce decrease in throughput even when wet etching is performed on the insulating layer including an aluminum oxide.

Furthermore, in the TFT substrate, an electrode breaks at an edge portion of the opening provided in the insulating layer, which is problematic.

The present disclosure is conceived in view of the above problem, and has as a second object to provide a TFT substrate and a method of manufacturing the TFT substrate which can reduce breakage of the electrode at the edge portion of the opening of the insulating layer.

In order to achieve the aforementioned first object, an aspect of a first method of manufacturing a thin film transistor (TFT) substrate is a method of manufacturing a TFT substrate in which a TFT including an oxide semiconductor layer is formed, the method including: forming an insulating layer to cover the oxide semiconductor layer; and forming an opening in the insulating layer, wherein the insulating layer includes a first film, a second film which is provided above the first film and is an aluminum oxide film, and a third film which is provided above the second film and is a film including silicon, and the forming of an opening includes: forming a resist pattern above the third film; processing the third film by dry etching; and processing the second film by wet etching.

Furthermore, in order to achieve the aforementioned second object, an aspect of a thin film transistor (TFT) substrate includes: an insulating layer having an opening; and an electrode which is continuously provided in the opening and above the insulating layer, wherein the insulating layer includes a first film, a second film above the first film, and a third film above the second film, and the opening has a downward tapered shape at least in a cross section of the third film.

Furthermore, in order to achieve the aforementioned second object, an aspect of a second method of manufacturing a TFT substrate includes: forming an insulating layer; forming an opening in the insulating layer; and continuously forming an electrode in the opening and above the insulating layer, wherein the forming of an insulating layer includes: forming a first film; forming a second film above the first film; and forming a third film above the second film, the forming of an opening includes: forming a resist pattern above the third film; processing the third film by dry etching; processing the second film by wet etching; and processing the first film by dry etching, and in the processing of the third film, the opening is formed to have a downward tapered shape in a cross section of the third film.

Hereinafter, embodiments of a TFT substrate and a method of manufacturing the TFT substrate, and an organic EL display device and a method of manufacturing the organic EL display device are described with reference to the Drawings. Note that, each of the embodiments described below illustrates a preferred specific example of the present invention. Thus, the numerical values, shapes, materials, structural elements, the arrangement and connection of the structural elements, manufacturing steps (steps), the processing order of the steps etc. shown in the following embodiments are mere examples and are not intended to limit the present invention. Therefore, among the structural elements in the following embodiments, those structural elements which are not described in the independent claims indicating the broadest concept of the present invention are described as arbitrary structural elements.

Note that, the Drawings are schematic diagrams, and illustration is not necessarily strictly accurate. Furthermore, in the Drawings, structural elements having substantially the same configuration are given the same reference sign, and redundant description thereof shall be omitted.

Embodiment 1

1. Configuration of Organic EL Display Device 10

Figure 2:
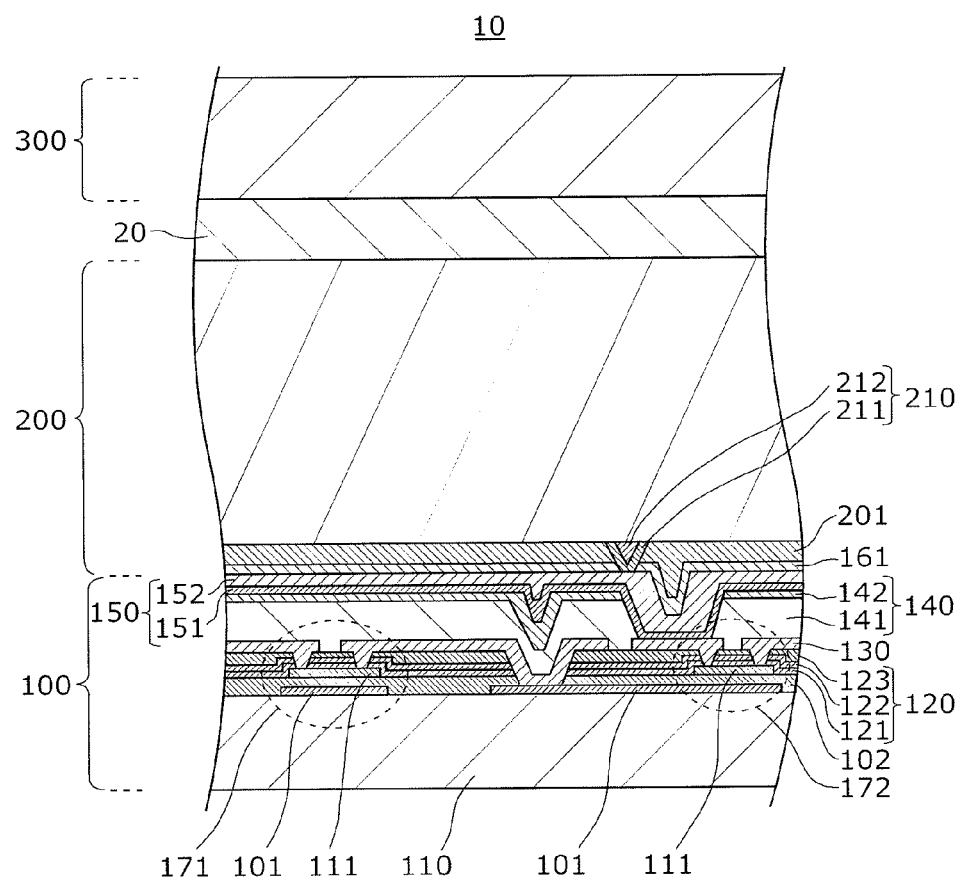
FIG. 2 is a diagram showing a part of a cross section taken along a line 2-2 in FIG. 1.
Figure 3:
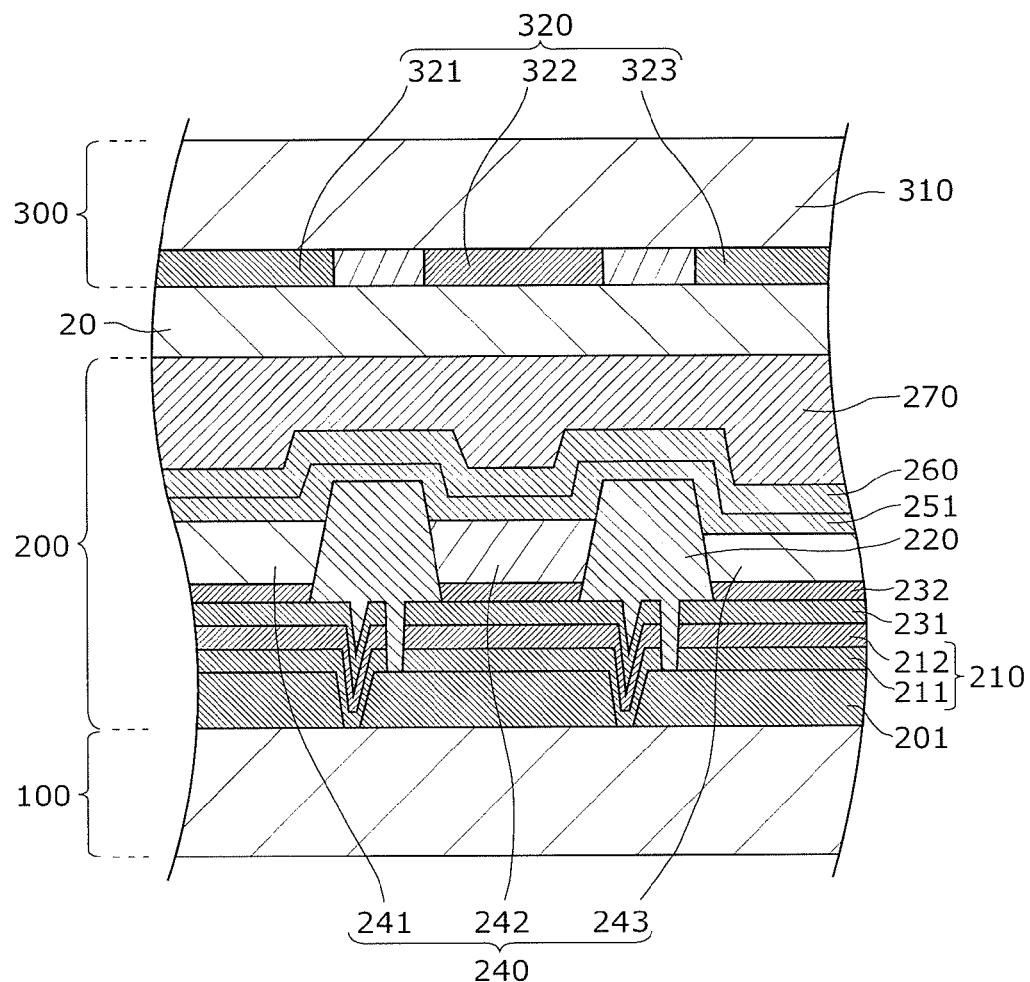
FIG. 3 is a diagram showing a part of a cross section taken along a line 3-3 in FIG. 1.

As illustrated in FIG. 1 to FIG. 3, an organic EL display device 10 disclosed here has a configuration in which a TFT substrate 100, an EL device unit 200, and a color filter substrate 300 are stacked. The EL device unit 200 and the color filter substrate 300 are attached via an attaching layer 20.

Note that, in FIG. 2, details of configurations of the EL device unit 200 and the color filter substrate are omitted where appropriate. In FIG. 3, details of configuration of the TFT substrate 100 are omitted where appropriate.

As illustrated in FIG. 1, the TFT substrate 100 includes a plurality of TFT units 170. As described later, each of the TFT units 170 includes at least two TFTs. The TFT units 170 are disposed in as matrix. Furthermore, signals are provided to the TFT units 170 through a gate line 180 and a source line 190.

As illustrated in FIG. 3, the EL device unit 200 includes a light-emitting layer 240. The light-emitting layer 240 emits light through recombination of a hole injected from an anode 210 and an electron injected from a cathode 260.

As illustrated in FIG. 1 and FIG. 3, the color filter substrate 300 includes a filter 320 provided above a glass substrate 310. The filter 320 includes a red filter 321, a green filter 322, and a blue filter 323. The red filter 321 transmits red light emitted from the EL device unit 200. The green filter 322 transmits green light emitted from the EL device unit 200. The blue filter 323 transmits blue light emitted from the EL device unit 200. Specifically, the disclosed organic EL display device 10 is of a top-emission type.

An organic EL display device of a bottom-emission type emits light from a TFT substrate side. In contrast, in the case of a top-emission type, a TFT substrate is not formed in a direction light is emitted. Thus, the top-emission type can provide a higher aperture ratio compared with the bottom-emission type. In other words, the top-emission type has even greater light-emission efficiency.

1-1. Configuration of TFT Substrate 100

As illustrated in FIG. 1 and FIG. 2, the TFT substrate 100 includes a plurality of the TFT units 170 above a glass substrate 110. Each of the TFT units 170 includes a switching TFT 171 and a drive TFT 172. The switching TFT 171 switches the drive TFT 172 between on and off. The drive TFT 172 controls a current supplied to the EL device unit 200.

A gate electrode 101 is connected to the gate line 180. A first electrode 130 is connected to the source line 190.

When a gate signal is inputted to the gate line 180, the switching TFT 171 turns to an on-state. Then, an electric charge supplied through the source line 190 is accumulated in a capacitor (not illustrated). Conductance of the drive TFT 172 continuously changes due to the electric charge accumulated in the capacitor (not illustrated). Thus, a driving current which causes the EL device unit 200 to emit light can be passed to the EL device unit 200 to provide a desired luminance.

The TFT unit 170 disclosed here is of a bottom-gate type. The gate electrode 101 has, for example, a configuration in which a copper (Cu) film is stacked above a molybdenum (Mo) film provided above the glass substrate 110. The gate electrode 101 is covered by a gate insulating film (gate oxide film) 102.

The gate insulating film 102 has, for example, a configuration in which a silicon dioxide ($SiO_2$) is stacked above a silicon nitride (SiN). A portion of the gate insulating film 102 is opened to communicate a signal to the gate electrode 101 of the drive TFT 172.

A semiconductor layer 111 is provided above the gate insulating film 102. For example, a transparent amorphous oxide semiconductor (TAOS), amorphous silicon, or the like is used for the semiconductor layer 111. An example of a TAOS material is an amorphous-indium gallium zinc oxide (a-$InGaZnO_4$).

The semiconductor layer 111 is covered by a first insulating layer 120. The first insulating layer 120 has a three-layer structure of a first film 121, a second film 122, and a third film 123. The first insulating layer 120 is an insulating layer which electrically isolates the semiconductor layer 111 and the first electrode 130. Furthermore, the first insulating layer 120 above the semiconductor layer 111 serves as an etch-stop layer. A configuration of the first insulating layer 120 will be described later in detail.

A portion of the first insulating layer 120 is opened. Through the opened portion (opening), the first electrode 130 is connected to the semiconductor layer 111. In FIG. 2, facing the drawing, the first electrode 130 connected to a right side (drain side) of the switching TFT 171 is connected to the gate electrode 101 of the drive TFT 172. For example, Cu is used for the first electrode 130.

The first electrode 130 is covered by a protective layer 140. The protective layer 140 has a stacked structure of a first protective layer 141 and a second protective layer 142. For example, a $SiO_2$ is used for the first protective layer 141. For example, a SiN is used for the second protective layer 142. A portion of the protective layer 140 is opened to obtain a signal from the drive TFT 172.

A second electrode 150 is provided above the protective layer 140. The second electrode 150 has, for example, a stacked structure of a lower layer electrode 151 and an upper layer electrode 152. In FIG. 2, facing the drawing, the second electrode 150 is connected to the first electrode 130 that is on the left side (source side) of the drive TFT 172. For example, an indium tin oxide (ITO) is used for the lower layer electrode 151. For example, Cu is used for the upper layer electrode 152.

The second electrode 150 is covered by a insulating layer 161. A portion of the second insulating layer 161 is opened.

1-2. Configuration of EL Device Unit 200

[1-2-1. Planarizing Layer 201]

As illustrated in FIG. 3, the EL device unit 200 is connected to the TFT substrate 100 through an opened portion of a planarizing layer 201. Specifically, the anode 210 including an upper layer anode 212 and a lower layer anode 211 is connected to the TFT substrate 100. The planarizing layer 201 is provided above the TFT substrate 100. In other words, the planarizing layer 201 reduces an unevenness created above the TFT substrate 100. For example, a resin is used for the planarizing layer 201.

[1-2-2. Anode 210]

The anode 210 covers the planarizing layer 201. The opened portion of the planarizing layer 201 is filled by a portion of the anode 210. The anode 210 has, for example, a stacked structure of the lower layer anode 211 and the upper layer anode 212. For example, an aluminum alloy is used for the lower layer anode 211. For example, an indium zinc oxide (IZO) is used for the upper layer anode 212. The anode 210 reflects light emitted from the light-emitting layer 240. This is for achieving even higher light-emission efficiency in the organic EL display device of a top-emission type.

[1-2-3. Hole Injection Layer 231]

A hole injection layer 231 covers the anode 210. The hole injection layer 231 injects a hole to the light-emitting layer 240. An ionization energy of the hole injection layer 231 is selected to be between a work function of the anode 210 and an ionization energy of the light-emitting layer 240. For example, the hole injection layer 231 is made from (i) an organic material of phthaiocyanine, oiigoamine, dendrimer amine, polythiophene series, or the like or (ii) an inorganic material, such as a metal oxide, or the like. For example, a tungsten oxide film is used for the hole injection layer 231.

[1-2-4. Electron Blocking Layer 232]

An electron blocking layer 232 covers the hole injection layer 231. The electron blocking layer 232 reduces chances where an electron injected from an electron injection layer 251, which will be described later, reaches the hole injection layer 231. An ionization energy of the electron blocking layer 232 is greater than an ionization energy of the light-emitting layer 240. For example, a polymeric material is used for the electron blocking layer 232.

[1-2-5. Light-Emitting Layer 240]

The light-emitting layer 240 includes, for example, a red-light-emitting layer 241 which emits red light, a green-light-emitting layer 242 which emits green light, and a blue-light-emitting layer 243 which emits blue light. As illustrated in FIG. 3, the red-light-emitting layer 241, the green-light-emitting layer 242, and the blue-light-emitting layer 243 are separately provided in one of the regions partitioned by banks 220. The light-emitting layer 240 is positioned between the electron blocking layer 232 and the electron injection layer 251 which will be described later.

For the light-emitting layer 240, both a small molecule material and a polymeric material can be used. The small molecule material and the polymeric material are not necessarily strictly differentiated. Typically, a material which has a unit of repetition of a molecular structure, and has a large molecular weight is called a polymeric material. A polymeric material generally has a molecular weight larger than or equal to 10,000. The polymeric material has a molecular-weight distribution. A small molecule material usually does not have a molecular-weight distribution.

The light-emitting layer 240 is a layer where an electron and a hole recombine. The light-emitting layer 240 includes a host and a dopant which functions as a center of light-emission when an electron and a hole recombine.

The host is, for example, of anthracene, amine, diamine, styryl, silole, azole, polyphenyl series, or the like.

An example of the anthracene series is a diphenylanthracene derivative, a diphenylanthracene derivative dimer, or the like. An example of the diamine series is bis carbazole, or the like. An example of the styryl series is a distyrylarylene, a styrylamine, or the like. The silole series is a material including a 5-membered ring containing silicon (Si). In other words, the silole series is one type of an electron-deficient ring. An example of the azole series is oxazole, oxadiazole, benzimidazole, or the like. An example of the polyphenyl series is terphenyl, quaterphenyl, quinquephenyl, sexiphenyl, or the like.

For the dopant, a material having an energy gap less than an energy gap of the host is selected. The dopant is usually added to be approximately 0.5 mol % to 5 mol % concentration. The amount of dopant to add is adjusted to reduce an effect of concentration quenching. In the light-emitting layer 240, the dopant becomes the center of light-emission. Thus, typically, the light-emitting layer 240 has the same EL spectrum as photoluminescence of the dopant.

An example of a dopant having a red center of light-emission is of cyano-methylene-pyran, dicyano, phenoxazone, thioxanthene series, or the like.

An example of a dopant having a blue center of light-emission is of styryl series, a fused polycyclic aromatic ring system, or the like.

An example of a dopant having a green center of light-emission is of coumarin, or quinacridone series, or the like.

[1-2-6. Electron Injection Layer 251]

The electron injection layer 251 covers the light-emitting layer 240 and the bank 220. The electron injection layer 251 injects an electron to the light-emitting layer 240. An electron affinity of the electron injection layer 251 is selected to be between a work function of the cathode 260 which will be described later and an electron affinity of the light-emitting layer 240. For example, the electron injection layer 251 is made from (i) an organic material of metal chelate, phenanthroline, oxadiazole, or triazole series, or the like or (ii) an inorganic material, such as an alkali metal compound, an alkaline earth metal compound, or the like.

[1-2-7. Cathode 260]

The cathode 260 covers the electron injection layer 251. In an organic EL display device of a top-emission type, it is desirable that an electrode on a display side (i.e., the cathode 260) have an increased visible light transmission factor. For example, a transparent conductive material or the like, such as an ITO, an IZO, or the like, is used for the cathode 260. Furthermore, the cathode 260 may be a stacked film in which a metal film is provided above a transparent conductive material film. For example, silver (Ag), aluminum (Al), or the like is used for the metal film.

[1-2-8. Sealing Layer 270]

A sealing layer 270 covers the cathode 260. In the case of the EL device unit 200 not sealed by the sealing layer 270, moisture in the environment or moisture from cleaning is more likely to enter inside the EL device unit 200. The water entered inside may cause detachment of a layer or the like. Consequently, a failure becomes more likely to occur, such as a failure to provide normal light emission. Thus, it is preferable to provide the sealing layer 270.

The sealing layer 270 is made from an organic material, such as poly-para-xylene, fluoride resin, or the like, an oxide material, such as $SiO_2$, an germanium oxide (GeO), aluminum oxide ($Al_2O_3$), or the like, or a nitride material, such as a silicon oxynitride (SiON), a SiN, or the like. Note that, the sealing layer 270 may have a configuration in which layers of materials of a plurality of types are stacked. For example, a SiN is used in the EL device unit 200 disclosed here.

1-3. Color Filter Substrate 300

The color filter substrate 300 changes a color of emitted light by absorption of light. In other words, color purity improves as light passes through the color filter substrate 300. The filter 320 adjusts a wavelength of transmitted light with a pigment or the like.

2. Manufacturing Method of Organic EL Display Device 10

Figure 4:
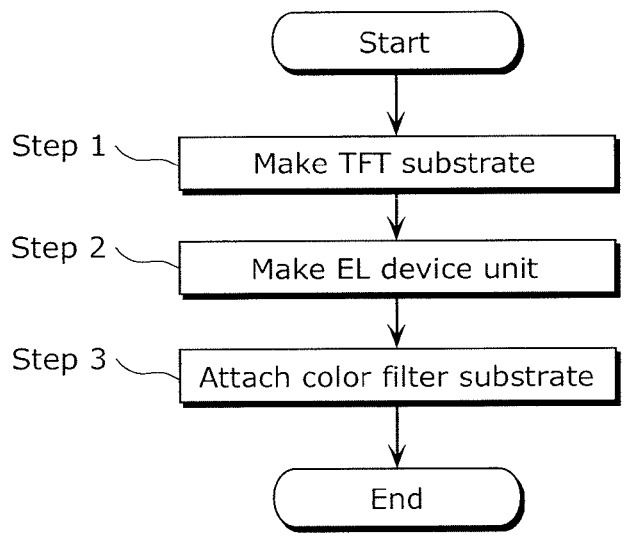
FIG. 4 is a manufacturing flow diagram of the organic EL display device according to Embodiment 1.

As illustrated in FIG. 4, a method of manufacturing the organic EL display device 10 includes: a manufacturing step (step 1) of making the TFT substrate 100, a manufacturing step (step 2) of making the EL device unit 200; and a manufacturing step (step 3) of attaching the color filter substrate 300.

The manufacturing step (step 1) of making the TFT substrate 100 and the manufacturing step (step 2) of making the EL device unit 200 will be described later in detail as a method of manufacturing the TFT substrate 100 and a method of manufacturing the EL device unit 200.

In the manufacturing step (step 3) of attaching the color filter substrate 300, as illustrated in FIG. 3, the EL device unit 200 and the color filter substrate 300 are attached via the attaching layer 20. For example, a UV-curable resin is used for the attaching layer 20. The attaching layer 20 has a film thickness of approximately 10 µm to 30 µm. Note that, a method of making the color filter substrate 300 will be described later.

As described earlier, the TFT substrate 100 is covered by the planarizing layer 201 that includes the opened portion. Thus, after only the EL device unit 200 is separately made, it is not easy to attach the EL device unit 200 and the TFT substrate 100. On the other hand, after the color filter substrate 300 is separately made, it is easy to attach the color filter substrate 300 and the EL device unit 200.

2-1. Manufacturing Method (Step 1) of Tft Substrate 100

Figure 5:
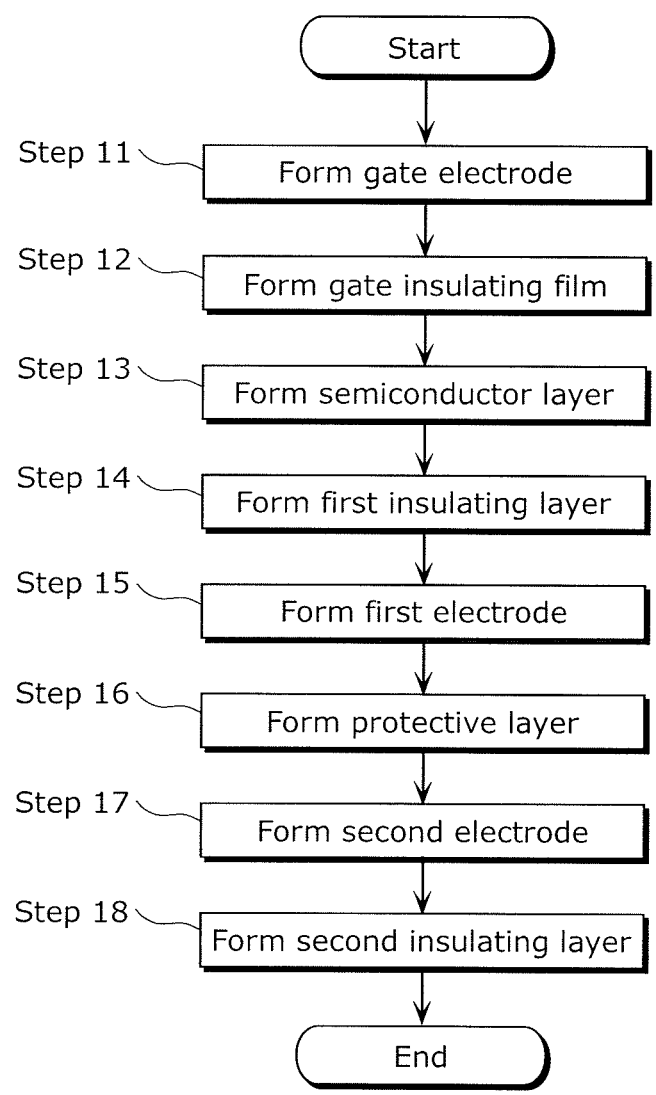
FIG. 5 is a manufacturing flow diagram of a TFT substrate according to Embodiment 1.

As illustrated in FIG. 5, a method of manufacturing the TFT substrate 100 includes, for example: a manufacturing step (step 11) of forming the gate electrode 101; a manufacturing step (step 12) of forming the gate insulating film 102; a manufacturing step (step 13) of forming the semiconductor layer 111; a manufacturing step (step 14) of forming the first insulating layer 120; a manufacturing step (step 15) of forming the first electrode 130; a manufacturing step (step 16) of forming the protective layer 140; a manufacturing step (step 17) of forming the second electrode 150; and a manufacturing step (step 18) of forming the second insulating layer 161.

The TFT substrate 100 disclosed here is made with the processes from step 11 to step 18 as described.

[2-1-1. Step 11]

Figure 6:
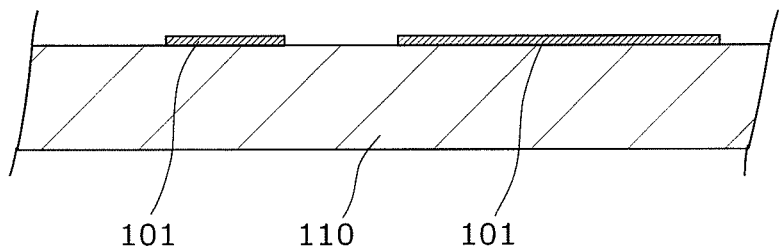
FIG. 6 is a schematic cross-sectional view after a formation of a gate electrode in a manufacturing process of the TFT substrate according to Embodiment 1.

As illustrated in FIG. 6, in step 11, the gate electrode 101 is formed above the glass substrate 110. For example, a Mo film and a Cu film are sequentially deposited above the glass substrate 110 using a sputtering method. A summed film thickness of the Mo film and the Cu film is approximately 50 nm to 150 nm.

Next, the gate electrode 101 having a predetermined pattern is formed by photolithography and etching using a resist.

[2-1-2. Step 12]

Figure 7:
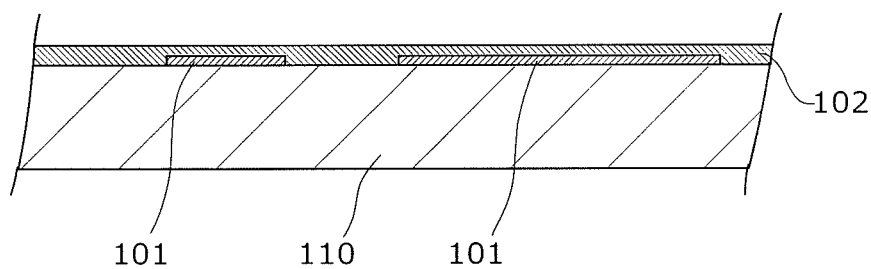
FIG. 7 is a schematic cross-sectional view after a formation of a gate insulating film in the manufacturing process of the TFT substrate according to Embodiment 1.

As illustrated in FIG. 7, in step 12, the gate insulating film 102 is formed which covers the gate electrode 101. For example, a $SiO_2$ film having a film thickness of approximately 100 nm to 300 nm is formed by a parallel-plate type plasma chemical vapor deposition (CVD). The material includes, for example, $SiH_4$ and $N_2O$. Plasma is generated, for example, with application of high frequency of 13.56 MHz. The $SiH_4$ and $N_2O$ are decomposed in plasma, and $SiO_2$ cluster is created. $SiO_2$ is deposited above the glass substrate 110 due to self-bias generated in plasma.

[2-1-3. Step 13]

Figure 8:
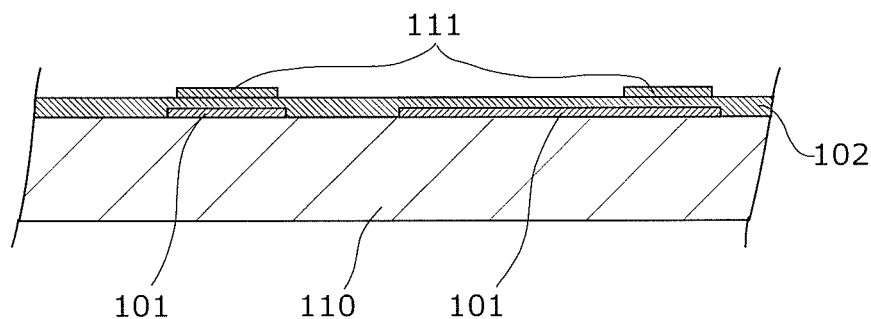
FIG. 8 is a schematic cross-sectional view after a formation of a semiconductor layer in the manufacturing process of the TFT substrate according to Embodiment 1.

As illustrated in FIG. 8, in step 13, the semiconductor layer 111 is formed above the gate insulating film 102. When a TAOS is used as the semiconductor layer 111, a sputtering method is used, for example. For example, a target material in which a composition ratio of In:Ga:Zn is 1:1:1 is used. The target material is sputtered in an oxygen atmosphere. With this, a film of a-$InGaZnO_4$ is formed. The film thickness is, for example, approximately 30 nm to 150 nm. Furthermore, when heat treatment at approximately 200 degrees Celsius to 500 degrees Celsius is performed in air, a property of TFT improves.

When amorphous silicon is used as the semiconductor layer 111, a plasma CVD method is used, for example. For example, when monosilane is used for a material, the monosilane is decomposed into silicon and hydrogen in plasma. The silicon is deposited in an amorphous state above the gate insulating film 102. The film thickness is approximately 30 nm to 150 nm, for example.

Next, the semiconductor layer 111 having a predetermined pattern is formed by photolithography and etching using a resist.

[2-1-4. Step 14]

Figure 9:
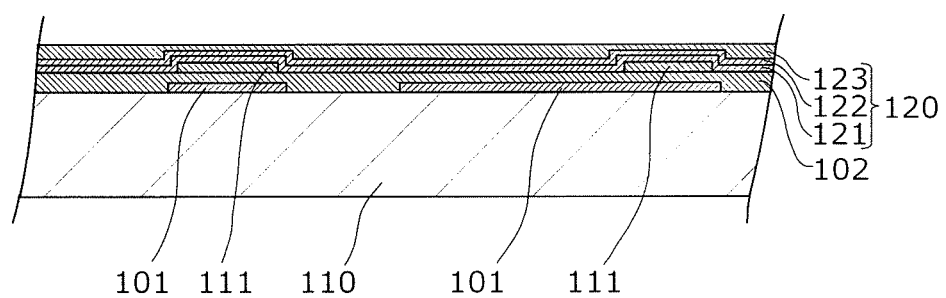
FIG. 9 is a schematic cross-sectional view after a formation of a first insulating layer in the manufacturing process of the TFT substrate according to Embodiment 1.

As illustrated in FIG. 9, in step 14, the first insulating layer 120 is formed above the gate insulating film 102 and the semiconductor layer 111. A method of forming the first insulating layer 120 will be described later in detail.

[2-1-5. Step 15]

Figure 10:
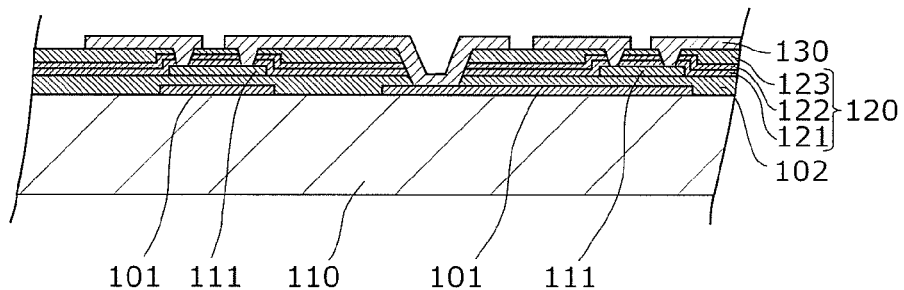
FIG. 10 is a schematic cross-sectional view after a formation of a first electrode in the manufacturing process of the TFT substrate according to Embodiment 1.

As illustrated in FIG. 10, in step 15, the first electrode 130 is formed. The first electrode 130 contacts the gate electrode 101 and a source/a drain in the semiconductor layer 111. A method of forming the first electrode 130 will be described later in detail.

[2-1-6. Step 16]

Figure 11:
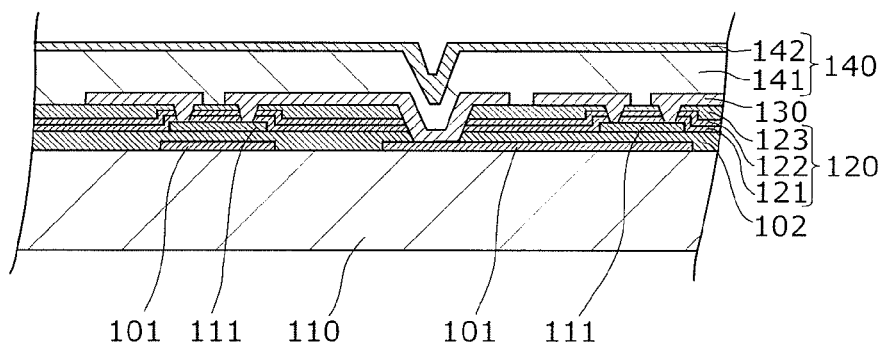
FIG. 11 is a schematic cross-sectional view after a formation of a protective layer in the manufacturing process of the TFT substrate according to Embodiment 1.

As illustrated in FIG. 11, in step 16, the protective layer 140 is formed. The protective layer 140 disclosed here has, for example, a stacked structure of the first protective layer 141 and the second protective layer 142. As the first protective layer 141, a $SiO_2$ film having a film thickness of approximately 100 nm to 400 nm is formed by parallel-plate type plasma CVD, for example. The material includes, for example, $SiH_4$ and $N_2O$.

As the second protective layer 142, a SiN film having a film thickness of approximately 50 nm to 200 nm is formed by parallel-plate type plasma CVD, for example. The material includes, for example, $SiH_4$ and ammonia ($NH_3$).

[2-1-7. Step 17]

Figure 12:
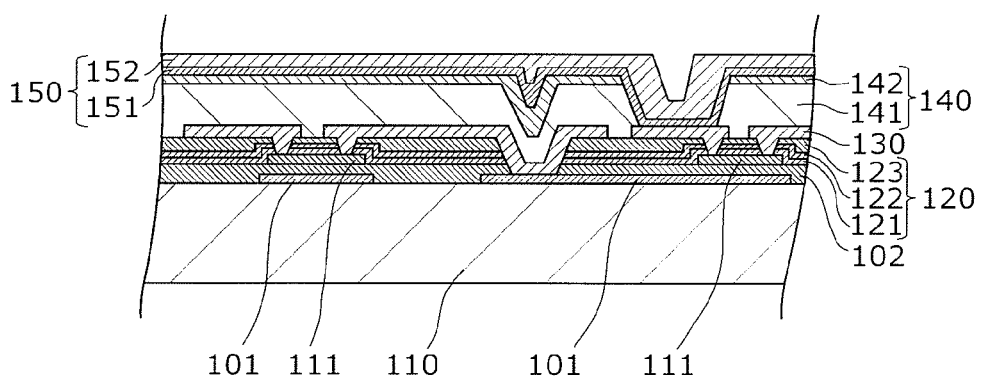
FIG. 12 is a schematic cross-sectional view after a formation of a second electrode in the manufacturing process of the TFT substrate according to Embodiment 1.

As illustrated in FIG. 12, in step 17, the second electrode 150 is formed. The second electrode 150 has, for example, a stacked structure of the lower layer electrode 151 and the upper layer electrode 152. The second electrode 150 contacts the first electrode 130. First, a predetermined region of the protective layer 140 is opened by photolithography and etching.

Next, an ITO film is deposited by sputtering. The ITO film has a film thickness of, for example, approximately 50 nm to 150 nm. Next, a Cu film is deposited by sputtering. The Cu film has a film thickness of, for example, approximately 100 nm to 400 nm.

Next, the ITO film and the Cu film are processed into predetermined patterns by photolithography and etching. As described above, the lower layer electrode 151 that is ITO and the upper layer electrode 152 that is Cu are formed.

[2-1-8. Step 18]

Figure 13:
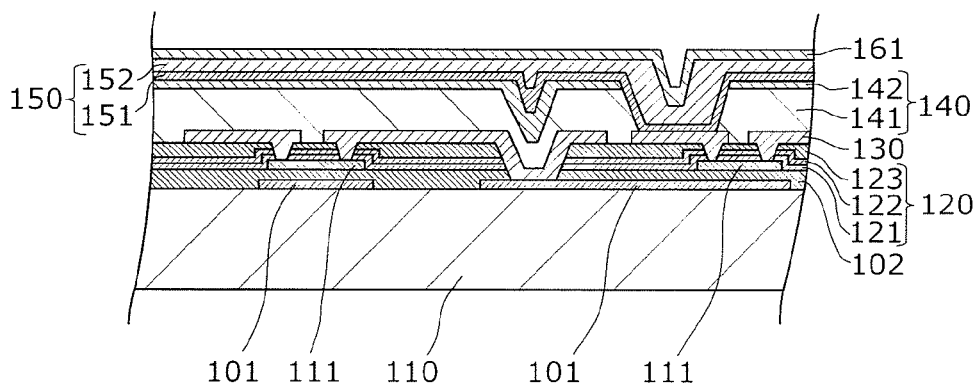
FIG. 13 is a schematic cross-sectional view after a formation of a second insulating layer in the manufacturing process of the TFT substrate according to Embodiment 1.

As illustrated in FIG. 13, in step 18, the second insulating layer 161 is formed. As the second insulating layer 161, a SiN film having a film thickness of approximately 50 nm to 200 nm is formed by parallel-plate type plasma CVD, for example. The material includes, for example, $SiH_4$ and ammonia.

With the step 11 to step 18 described above, the TFT substrate 100 is made.

[2-2. Manufacturing Method of EL Device Unit 200 (Step 2)]

Figure 14:
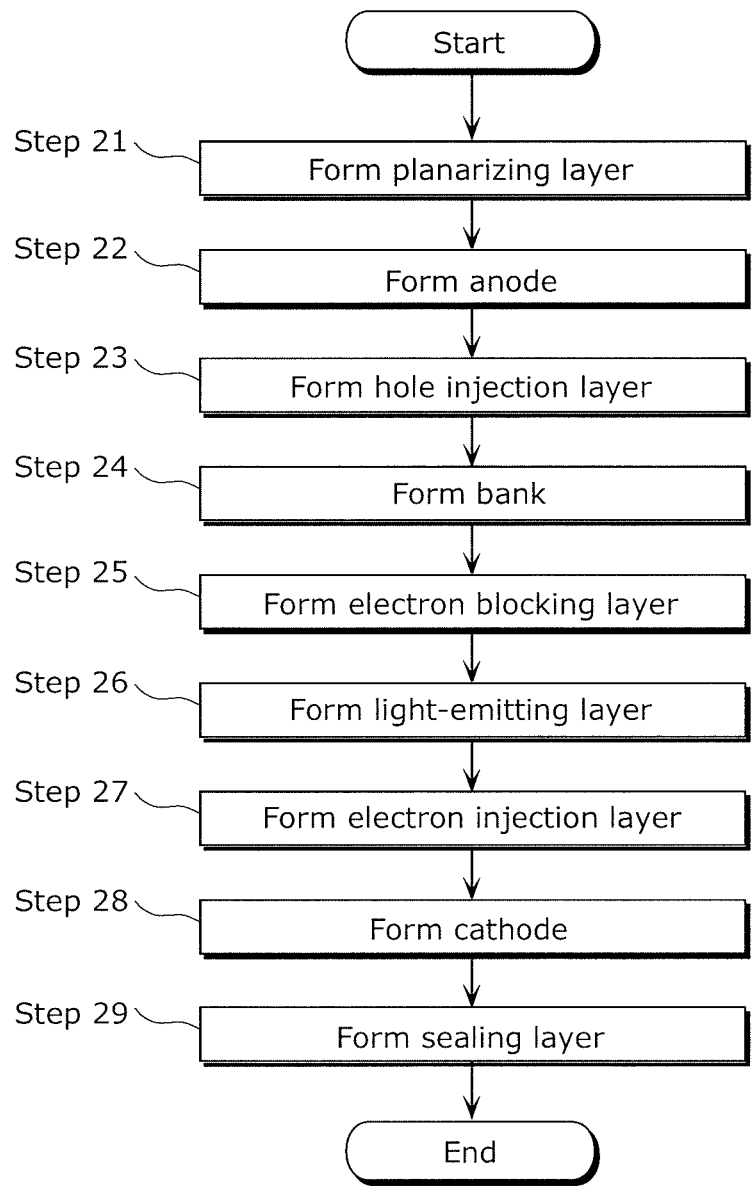
FIG. 14 is a manufacturing flow diagram of an EL device unit according to Embodiment 1.

As illustrated in FIG. 14, for example, a method of manufacturing the EL device unit 200 includes: a manufacturing step (step 21) of forming the planarizing layer 201; a manufacturing step (step 22) of forming the anode 210; a manufacturing step (step 23) of forming the hole injection layer 231; a manufacturing step (step 24) of forming the bank 220; a manufacturing step (step 25) of forming the electron blocking layer 232; a manufacturing step (step 26) of forming the light-emitting layer 240; a manufacturing step (step 27) of forming the electron injection layer 251; a manufacturing step (step 28) of forming the cathode 260; and a manufacturing step (step 29) of forming the sealing layer 270.

The EL device unit 200 disclosed here is made with manufacturing steps of step 21 to step 29 as described.

[2-2-1. Step 21]

Figure 15:
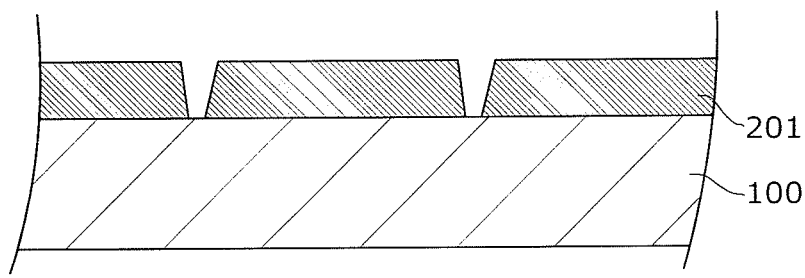
FIG. 15 is a schematic cross-sectional view after a formation of a planarizing layer in a manufacturing process of the EL device unit according to Embodiment 1.

As illustrated in FIG. 15, in step 21, the planarizing layer 201 is formed. For example, a photosensitive resin is used as the planarizing layer 201. Specifically, for example, a resin composition containing an acrylate compound that includes a radical reactive unsaturated compound, a resin composition containing a mercapto compound that includes an acrylate compound and a thiol group, or a resin composition in which multifunctional acrylate monomer, such as epoxy acrylate, urethane acrylate, polyester acrylate, polyether acrylate, polyethylene glycol acrylate, glycerol methacrylate, or the like, is dissolved is used. Furthermore, an arbitrary mixture of the above-described resin compositions can also be used. Note that, the photosensitive resin is not particularly limited as long as a reactive monomer that includes in a molecule at least one photopolymerizable unsaturated bond is contained. The photosensitive resin is dispersed in a solvent.

First, for example, a photosensitive resin is formed above the TFT substrate 100 using an application method. A surface above which the photosensitive resin is applied is a surface above which the second insulating layer 161 is provided. Next, photolithography and development are performed. This is for forming an opening for connection to the TFT substrate 100. Next, heat treatment is performed in an air. A temperature of the heat treatment is approximately 150 degrees Celsius to 250 degrees Celsius. A remaining solvent volatilizes due to the heat treatment. The planarizing layer 201 after the heat treatment has a film thickness of approximately 2 µm to 5 µm. Next, the second insulating layer 161 is etched using the planarizing layer 201 as a mask. This is for exposing a surface of the second electrode 150.

[2-2-2. Step 22]

Figure 16:
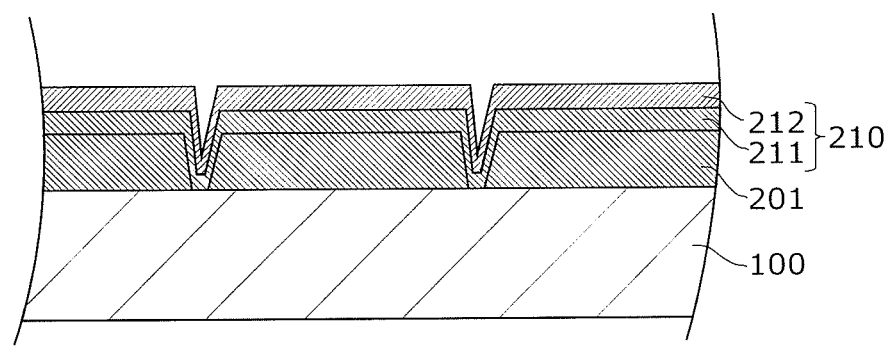
FIG. 16 is a schematic cross-sectional view after a formation of a reflective anode in the manufacturing process of the EL device unit according to Embodiment 1.

As illustrated in FIG. 16, in step 22, the anode 210 is formed. The anode 210 has, for example, a stacked structure of the lower layer anode 211 and the upper layer anode 212. For example, an aluminum alloy is used for the lower layer anode 211. For example, an IZO is used for the upper layer anode 212. The lower layer anode 211 and the upper layer anode 212 are formed, for example, by sputtering. The lower layer anode 211 has a film thickness of, for example, approximately 100 nm to 500 nm. The upper layer anode 212 has a film thickness of, for example, approximately 5 nm to 30 nm.

[2-2-3. Step 23]

Figure 17:
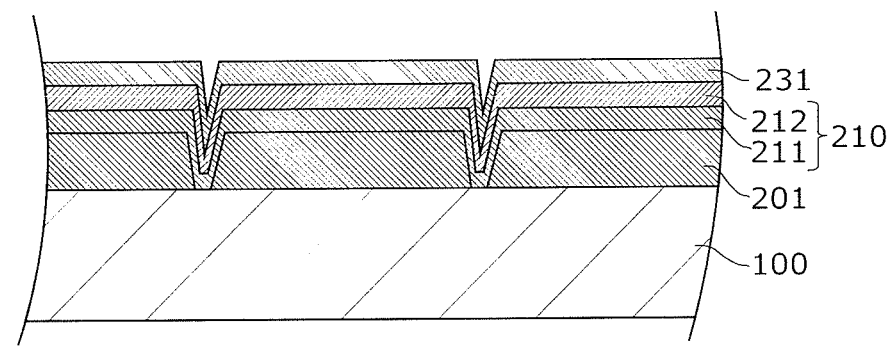
FIG. 17 is a schematic cross-sectional view after a formation of a hole injection layer in the manufacturing process of the EL device unit according to Embodiment 1.

As illustrated in FIG. 17, in step 23, the hole injection layer 231 is formed. For example, a tungsten oxide film is used for the hole injection layer 231. The hole injection layer 231 is formed, for example, by sputtering. The composition of the tungsten oxide is expressed as WOx (2≤x≤3). The hole injection layer 231 has a film thickness of, for example, approximately 2 nm to 20 nm.

[2-2-4. Step 24]

Figure 18:
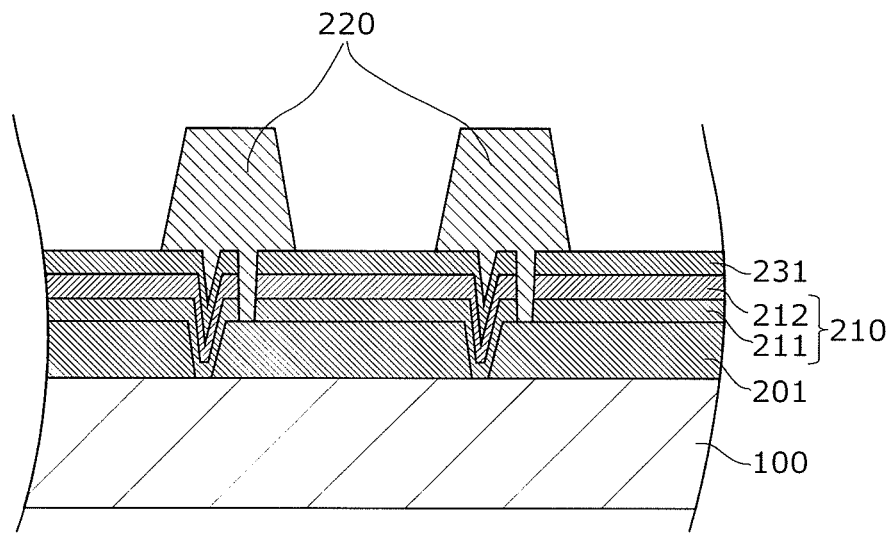
FIG. 18 is a schematic cross-sectional view after a formation of a bank in the manufacturing process of the EL device unit according to Embodiment 1.

As illustrated in FIG. 18, in step 24, the bank 220 is formed. First, the hole injection layer 231 and the anode 210 are patterned into a pixel shape. Specifically, an opening region is formed in the hole injection layer 231 and the anode 210 by photolithography and etching using a resist.

For example, a photosensitive resin is used as the bank 220. Specifically, for example, a resin composition containing an acrylate compound that includes a radical reactive unsaturated compound, a resin composition containing a mercapto compound that includes an acrylate compound and a thiol group, or a resin composition in which multifunctional acrylate monomer, such as epoxy acrylate, urethane acrylate, polyester acrylate, polyether acrylate, polyethylene glycol acrylate, glycerol methacrylate, or the like, is dissolved is used. Furthermore, an arbitrary mixture of the above-described resin compositions can also be used. Note that, the photosensitive resin is not particularly limited as long as a reactive monomer that includes in a molecule at least one photopolymerizable unsaturated bond is contained. The photosensitive resin is dispersed in a solvent.

For example, the photosensitive resin is formed in the aforementioned opening region and above the hole injection layer 231 using an application method. Next, photolithography and development are performed. Next, heat treatment is performed in an air. A temperature of the heat treatment is approximately 150 degrees Celsius to 250 degrees Celsius. A remaining solvent volatilizes due to the heat treatment. The bank 220 after the heat treatment has a film thickness of approximately 0.5 µm to 2 µm. Note that, subsequent processes become easy when a side surface of the bank 220 is in a downward tapered shape, which is preferable.

[2-2-5. Step 25]

Figure 19:
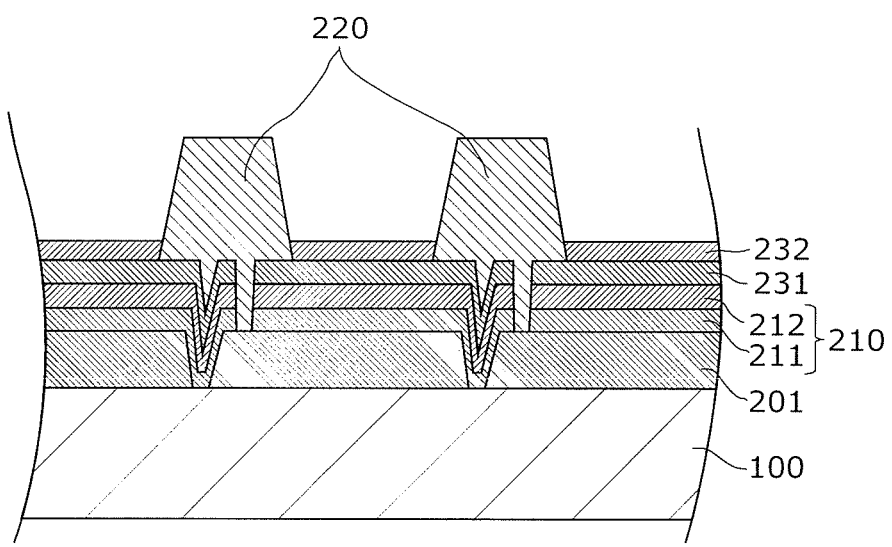
FIG. 19 is a schematic cross-sectional view after a formation of an electron blocking layer in the manufacturing process of the EL device unit according to Embodiment 1.

As illustrated in FIG. 19, in step 25, the electron blocking layer 232 is formed. For example, amine-based polymer is used as the electron blocking layer 232. An amine-based polymer becomes a printing ink, for example, when dispersed in a solvent. The printing ink is applied above the hole injection layer 231, for example, with an ink jet device. Next, vacuum drying and heat treatment are performed. A temperature of the heat treatment is approximately 150 degrees Celsius to 250 degrees Celsius.

The solvent volatilizes due to the heat treatment. The electron blocking layer 232 has a film thickness of approximately 5 nm to 20 nm.

[2-2-6. Step 26]

Figure 20:
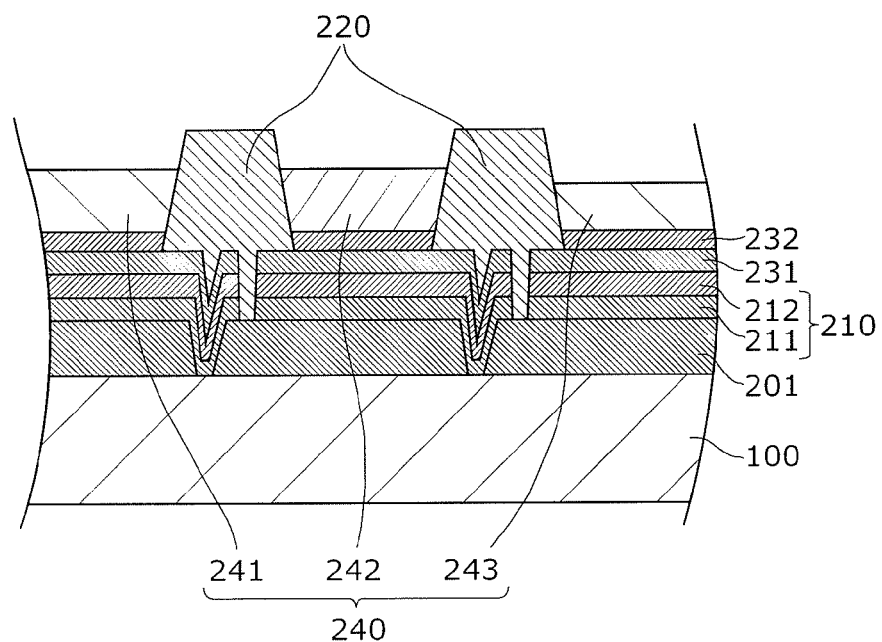
FIG. 20 is a schematic cross-sectional view after a formation of a light-emitting layer in the manufacturing process of the EL device unit according to Embodiment 1.

As illustrated in FIG. 20, in step 26, the light-emitting layer 240 is formed. For example, a material obtained by adding a dopant to a polymeric material host is used as the light-emitting layer 240. The polymeric material becomes a printing ink, for example, when dispersed in a solvent. The printing ink is applied above the electron blocking layer 232, for example, with an ink jet device. The red-light-emitting layer 241, the green-light-emitting layer 242, and the blue-light-emitting layer 243 are individually applied. Note that, when an ink jet device including a plurality of heads is used, the red-light-emitting layer 241, the green-light-emitting layer 242, and the blue-light-emitting layer 243 can be simultaneously applied.

Film thicknesses of the red-light-emitting layer 241, the green-light-emitting layer 242, and the blue-light-emitting layer 243 are appropriately set to balance luminance. More specifically, a color with a relatively great light emission amount per a unit film thickness is set to have a relatively small film thickness. A color with a relatively small light emission amount per the unit film thickness is set to have a relatively great film thickness. The film thickness is adjusted with viscosity of the printing ink, an opening size of a head, or the like. Next, heat treatment is performed. A temperature of the heat treatment is approximately 150 degrees Celsius to 250 degrees Celsius. A remaining solvent volatilizes due to the heat treatment. The light-emitting layer 240 has a film thickness of approximately 40 nm to 100 nm.

[2-2-7. Step 27]

Figure 21:
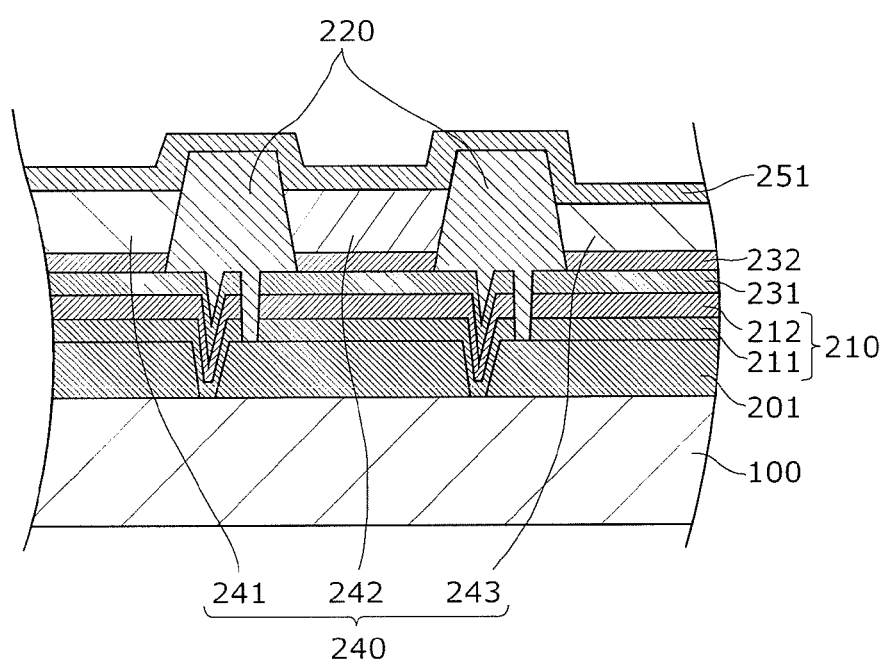
FIG. 21 is a schematic cross-sectional view after a formation of an electron injection layer in the manufacturing process of the EL device unit according to Embodiment 1.

As illustrated in FIG. 21, in step 27, the electron injection layer 251 is formed. For example, a material obtained by adding barium (Ba) to a small molecule material is used as the electron injection layer 251. The material of the electron injection layer 251 is formed above the light-emitting layer 240 and above the bank 220 using, for example, a vapor deposition method. The electron injection layer 251 has a film thickness of approximately 2 nm to 50 nm.

[2-2-8. Step 28]

Figure 22:
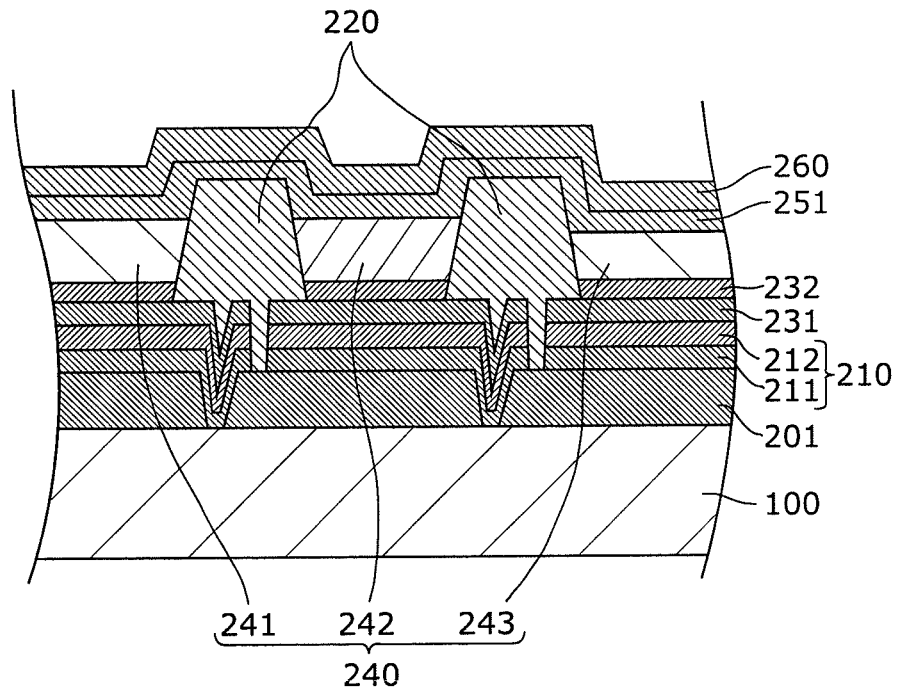
FIG. 22 is a schematic cross-sectional view after a formation of a cathode in the manufacturing process of the EL device unit according to Embodiment 1.

As illustrated in FIG. 22, in step 28, the cathode 260 is formed. For example, an ITO is used as the cathode 260. The cathode 260 is formed above the electron injection layer 251 by sputtering. The cathode 260 has a film thickness of approximately 20 nm to 50 nm.

[2-2-9. Step 29]

Figure 23:
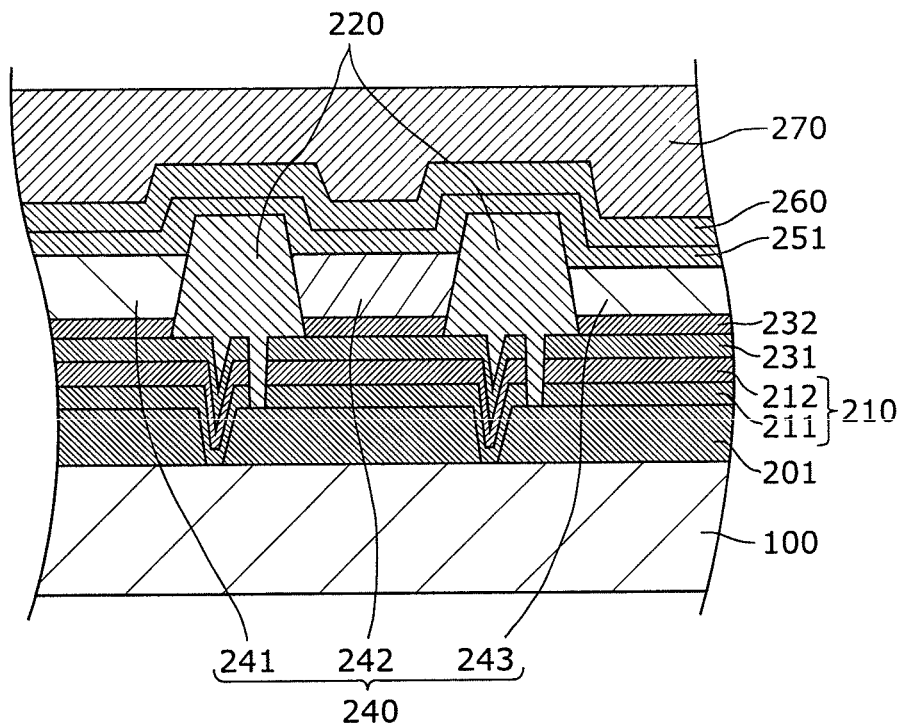
FIG. 23 is a schematic cross-sectional view after a formation of a sealing layer in the manufacturing process of the EL device unit according to Embodiment 1.

As illustrated in FIG. 23, in step 29, the sealing layer 270 is formed. As the sealing layer 270, for example, a SiN film having a film thickness of approximately 500 nm to 800 nm is formed by parallel-plate type plasma CVD. The material includes, for example, $SiH_4$ and $NH_3$. Note that, it is preferable that step 27 to step 29 be sequentially performed in a vacuum. This is because a chance of exposure to an atmosphere including moisture is reduced.

With the above-described step 21 to step 29, the EL device unit 200 is made.

2-3. Manufacturing Method of Color Filter Substrate 300

The color filter substrate 300 can be made by forming the filter 320 above the glass substrate 310. The filter 320 is formed by photolithography or the like, as it has been known.

3. Details of First Insulating Layer 120 and First Electrode 130

3-1. Configuration of First Insulating Layer 120

Figure 24:
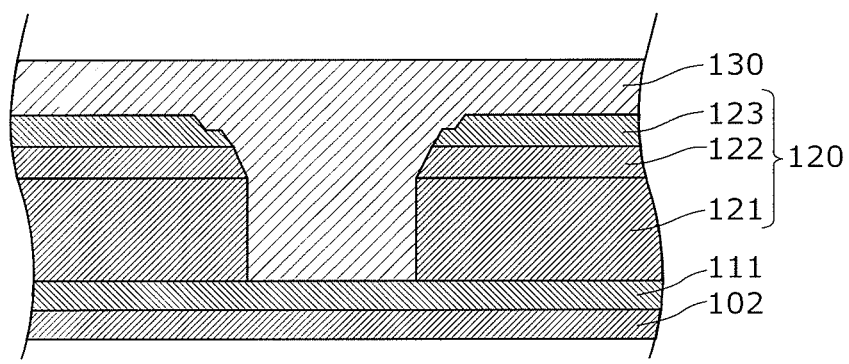
FIG. 24 is a schematic cross-sectional view of a periphery of an opening in the first insulating layer of the TFT substrate according to Embodiment 1.

The first insulating layer 120 is formed to cover the semiconductor layer 111. As illustrated in FIG. 24, the first insulating layer 120 is formed above the semiconductor layer 111 to be in contact with the semiconductor layer 111.

The first insulating layer 120 includes: the first film 121 provided above the semiconductor layer 111; the second film 122 provided above the first film 121; and the third film 123 provided above the second film 122. In this embodiment, the third film 123 is a topmost layer of the first insulating layer 120.

Furthermore, an opening is provided in a portion of the first insulating layer 120. A method of forming the opening will be described later in detail.

3-2. Formation Method of First Insulating Layer 120 (Step 14)

Figure 25:
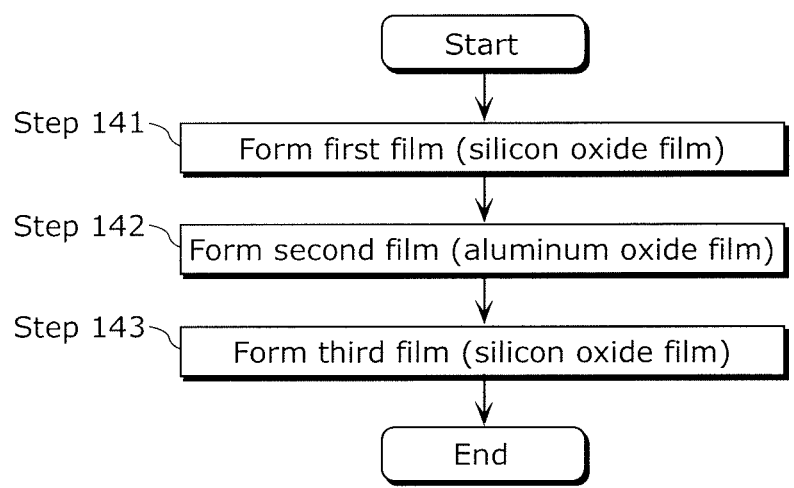
FIG. 25 is a formation flow diagram of the first insulating layer according to Embodiment 1.

As illustrated in FIG. 25, the first insulating layer 120 is formed, for example, with manufacturing steps of step 141 to step 143. In this embodiment, a manufacturing step (step 14) of forming the first insulating layer 120 includes: a manufacturing step (step 141) of forming the first film 121; a manufacturing step (step 142) of forming the second film 122; and a manufacturing step (step 143) of forming the third film 123.

[3-2-1. Step 141]

In step 141, the first film 121 is provided above the semiconductor layer 111. For example, a silicon oxide film is used for the first film 121. Formation of a silicon oxide film generates relatively small hydrogen compared with the formation of a silicon nitride film or the like. Thus, damage to the semiconductor layer 111 is reduced. More specifically, when an oxide such as TAOS or the like is used for the semiconductor layer 111, a composition of the semiconductor layer 111 changes due to a gas such as hydrogen or the like having a reducing action. In other words, the semiconductor layer 111 may fail to provide a performance comparable to a design value. Thus, the first film 121 may be an insulating film which generates less hydrogen during the formation.

The silicon oxide film is formed using, for example, a parallel-plate type plasma CVD apparatus. The material includes, for example, $SiH_4$ and $N_2O$, or the like. Parameters, such as a gas flow rate, a pressure, applied power, a frequency, and the like, of the apparatus are appropriately set according to a substrate size, a film thickness setting, or the like.

It is preferable that the first film 121 have a film thickness of no less than 100 nm and no more than 500 nm. When the first film 121 has a film thickness of less than 100 nm, electrical property of the semiconductor layer 111 is affected. Specifically, a fixed charge included in the second film 122 affects the semiconductor layer 111 via the first film 121. On the other hand, when the first film 121 has a film thickness of more than 500 nm, throughput during the manufacturing decreases.

Note that, the first film 121 is not limited to the silicon oxide film. Note that, the first film 121 may be an insulating film which can reduce damage to the semiconductor layer 111 during the formation of the first film 121.

[3-2-2. Step 142]

In step 142, the second film 122 is provided above the first film 121. For example, an aluminum oxide film (alumina film) is used for the second film 122. When the semiconductor layer 111 is an oxide semiconductor, electrical properties of the semiconductor layer 111 deteriorates due to damage by hydrogen or oxygen. However, with an aluminum oxide film formed above the semiconductor layer 111, the aluminum oxide film can block hydrogen or oxygen generated in an upper layer. With this, diffusion of hydrogen or oxygen to the semiconductor layer 111 can be reduced, and thus the semiconductor layer 111 having a stable electrical property can be provided.

The aluminum oxide film is formed using, for example, a reactive sputtering apparatus. In this case, aluminum is used for a target, and argon (Ar) and oxygen ($O_2$), or the like are used for a process gas. Parameters, such as a gas flow rate, a pressure, applied power, a frequency, and the like, of the apparatus are appropriately set according to a substrate size, a film thickness setting, or the like. Note that, an aluminum oxide can also be used for a target.

It is preferable that the second film 122 have a film thickness of no less than 10 nm and no more than 50 nm. When the film thickness of the second film 122 is less than 10 nm, the second film 122 functions less effectively in blocking hydrogen from the upper layer. On the other hand, when the film thickness of the second film 122 is more than 50 nm, throughput during the manufacturing decreases.

Furthermore, it is preferable that the second film 122 have a refractive index of approximately 1.55 to 1.65 with respect to light having a wavelength of 633 nm. As described later, the second film 122 is processed by wet etching. When the second film 122 has a refractive index within the above-described range, good workability is achieved.

[3-2-3. Step 143]

In step 143, the third film 123 is provided above the second film 122. The third film 123 is a film including silicon and is, for example, a silicon oxide film. As described later, the third film 123 is processed by dry etching. When the third film 123 is a silicon oxide film, isotropic etching using a gas containing fluorine (F) can be performed.

The third film 123 is formed using, for example, a parallel-plate type plasma CVD apparatus. When the silicon oxide film is formed, the material includes, for example, $SiH_4$ and $N_2O$, or the like. Parameters, such as a gas flow rate, a pressure, applied power, a frequency, and the like, of the apparatus are appropriately set according to a substrate size, a film thickness setting, or the like.

It is preferable that the third film 123 have a film thickness of no less than 100 nm and no more than 500 nm. When the film thickness of the third film 123 is less than 100 nm, workability decreases. Specifically, the isotropic etching deteriorates when dry etching is performed on the third film 123. In other words, it becomes difficult to cause the third film 123 to recede by a process using an etching gas. On the other hand, when the film thickness of the third film 123 is more than 500 nm, throughput during the manufacturing decreases.

Note that, a silicon nitride film may be used as the third film 123. The silicon nitride film is formed using, for example, a parallel-plate type plasma CVD apparatus, and the material includes, for example, $SiH_4$ and $NH_3$, or the like. Alternatively, a silicon oxynitride film may be used as the third film 123.

Note that, the protective layer 140 may have the same structure of the first insulating layer 120. In other words, the process of forming the first insulating layer 120 can also be used as a process of forming the protective layer 140.

3-3. Details of Opening of First Insulating Layer 120 and First Electrode 130

As illustrated in FIG. 24, a part of the first insulating layer 120 is opened to form an opening in the first insulating layer 120. For example, the opening is formed in the first insulating layer 120 to form a contact portion between the semiconductor layer 111 and the first electrode 130. The opening is formed by processes in which a portion of each of the first film 121, the second film 122, and the third film 123 is removed.

The first electrode 130 is a metal film and is, for example, a Cu film. The first electrode 130 is continuously provided (i) in the opening of the first insulating layer 120 and (ii) above the first insulating layer 120. The first electrode 130 is formed, for example, above the first insulating layer 120, filling the opening of the first insulating layer 120.

3-4. Details of Formation Method of Opening in First Insulating Layer 120 and Formation Method of First Electrode 130

Figure 26:
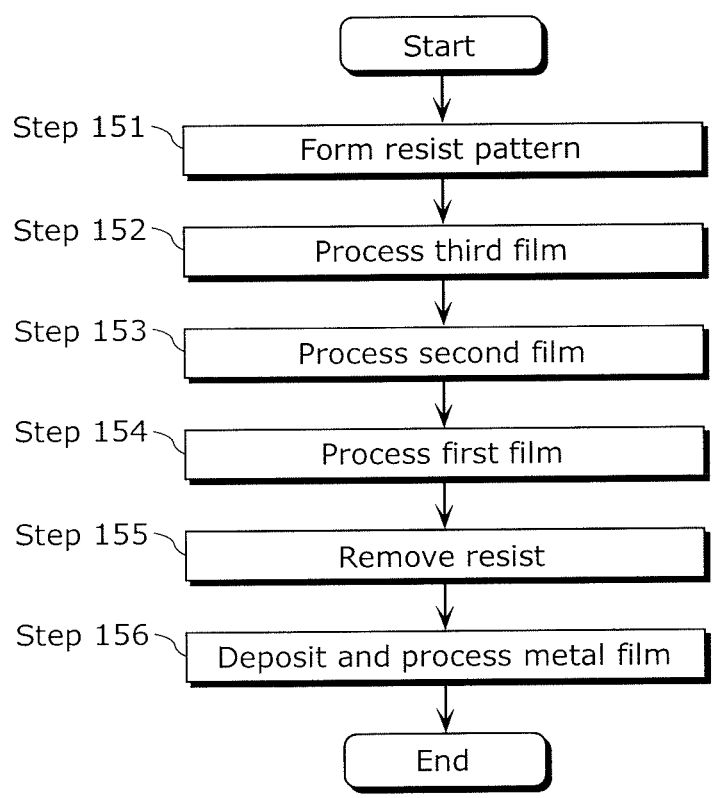
FIG. 26 is a formation flow diagram of (i) the opening in the first insulating layer and (ii) the first electrode.

As illustrated in FIG. 26, the opening of the first insulating layer 120 and the first electrode 130 are formed, for example, by manufacturing steps of step 151 to step 156.

Specifically, a manufacturing step of forming the opening in the first insulating layer 120 includes: a process (step 151) of forming a resist pattern 135; a manufacturing step (step 152) of processing the third film 123; a manufacturing step (step 153) of processing the second film 122; a manufacturing step (step 154) of processing the first film 121; and a manufacturing step (step 155) of removing the resist pattern 135. Furthermore, a manufacturing step of forming the first electrode 130 is a manufacturing step (step 156) of depositing and processing a metal film.

[3-4-1. Step 151]

Figure 27:
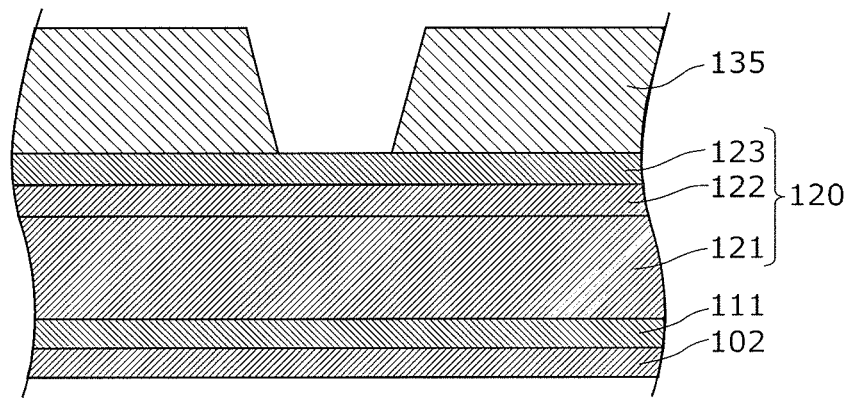
FIG. 27 is a schematic cross-sectional view after a formation of a resist pattern in a formation process of the opening in the first insulating layer according to Embodiment 1.

As illustrated in FIG. 27, in step 151, the resist pattern (resist film) 135 is formed above the first insulating layer 120. Specifically, a resist including a photosensitive resin material is applied to have a predetermined thickness above the first insulating layer 120. Next, the resist is exposed through a photomask that includes a pattern. Next, the resist is developed. With this, the resist pattern 135 in a predetermined shape is formed.

[3-4-2. Step 152]

Figure 28:
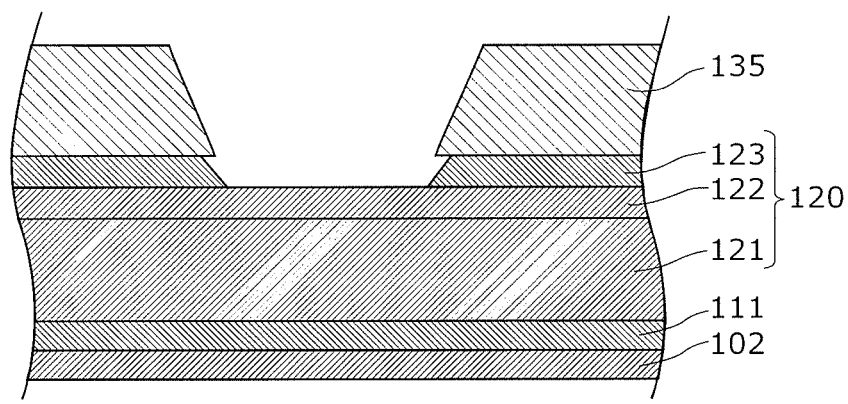
FIG. 28 is a schematic cross-sectional view after a third film is processed in the formation process of the opening in the first insulating layer according to Embodiment 1.

As illustrated in FIG. 28, in step 152, the third film 123 is processed. Specifically, dry etching is performed on the third film 123 that is a silicon oxide film. Due to the dry etching, the third film 123 in a layer under the opening of the resist pattern 135 is removed.

Furthermore, the etching gas at this time causes the edge of the opening of the resist pattern 135 to recede to widen the opening compared to before the etching. Furthermore, in this case, due to a difference between an etching rate of the resist pattern 135 and an etching rate of the third film 123, a shape is achieved in which an opening (opening size) of the third film 123 is wider than the opening (opening size) of the resist pattern 135.

Dry etching is performed using, for example, a reactive ion etching (RIE) apparatus. The etching gas includes, for example, sulfur hexafluoride ($SF_6$) and $O_2$. Parameters, such as a gas flow rate, a pressure, applied power, a frequency, and the like, of the apparatus are appropriately set according to a substrate size, etching quantity setting, or the like. An example of the etching conditions is: $SF_6$ is 70 sccm; $O_2$ is 30 sccm; pressure is 13 Pa; and applied power is 300 W, in the case of a 6-inch substrate.

Alternatively, the etching gas may include carbon tetrafluoride ($CF_4$) and $O_2$. In this case as well, parameters, such as a gas flow rate, a pressure, applied power, a frequency, and the like, of the apparatus are appropriately set according to a substrate size, etching quantity setting, or the like.

[3-4-3. Step 153]

Figure 29:
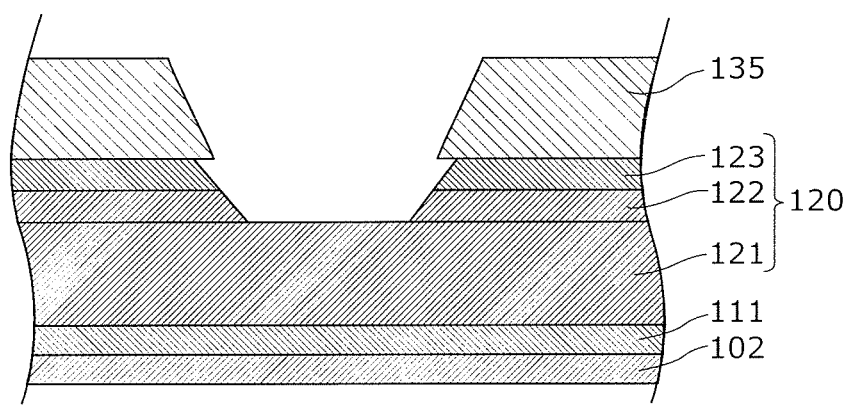
FIG. 29 is a schematic cross-sectional view after a second film is processed in the formation process of the opening in the first insulating layer according to Embodiment 1.

As illustrated in FIG. 29, in step 153, the second film 122 is processed. Specifically, wet etching is performed on the second film 122 that is an aluminum oxide film. Due to the wet etching, the second film 122 in a layer under the opening of the third film 123 is removed. At this time, instead of the resist pattern 135, the third film 123 serves as a mask pattern.

The resist pattern 135 is formed above the third film 123, and is not formed to be in contact with the second film (aluminum oxide film) 122. With this, stripping of the resist pattern 135 due to alkaline solution is reduced when the wet etching is performed. Furthermore, since the third film 123 serves as the mask pattern for the second film 122, the second film 122 can be processed into a desired shape even in a hypothetical case where the resist pattern 135 is damaged by the alkaline solution.

In this embodiment, an alkaline solution is used for an etching solution. This is because the alkaline solution has high etching rate with respect to an aluminum oxide film compared to an acid solution. Specifically, a potassium hydroxide (KOH) solution can be used.

The etching of the aluminum oxide film by a KOH solution can be performed, for example, in a range where a concentration of the KOH is no less than 1 wt % and no more than 40 wt %. The etching rate of the aluminum oxide film monotonically increases with an increase in the concentration of KOH. Thus, the concentration of KOH may be adjusted according to a desired etching rate. On the other hand, KOH reacts with a metal, such as Zn, Al, Sn, Pb, or the like, and generates hydrogen. Thus, use of a KOH solution of lower concentration is preferable as long as a sufficient etching rate is achieved. For example, when the requested etching rate is 10 nm/min, it is preferable that KOH concentration be no less than 1 wt % and no more than 5 wt %.

[3-4-4. Step 154]

Figure 30:
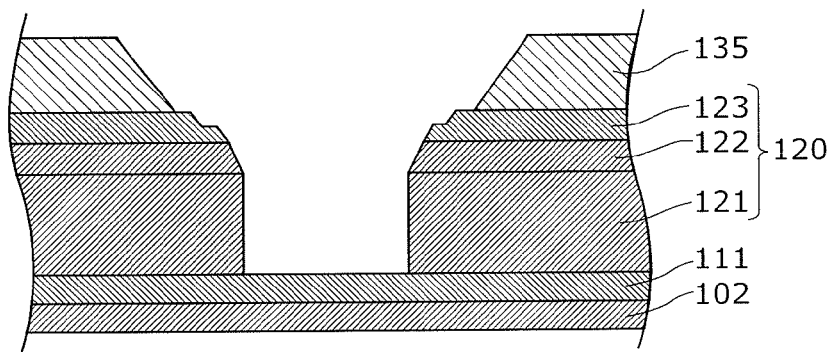
FIG. 30 is a schematic cross-sectional view after a first film is processed in the formation process of the opening in the first insulating layer according to Embodiment 1.

As illustrated in FIG. 30, in step 154, the first film 121 is processed. Specifically, dry etching is performed on the first film 121 that is a silicon oxide film. Due to the dry etching, the first film 121 in a layer under the opening of the second film 122 is removed. In this case, the first film 121 is processed using the second film 122 as a mask.

The dry etching may be performed, for example, using an RIE apparatus. The etching gas includes, for example, carbon tetrafluoride ($CF_4$) and $O_2$. Parameters, such as a gas flow rate, a pressure, applied power, a frequency, and the like, of the apparatus are appropriately set according to a substrate size, an etching quantity setting, or the like. An example of the etching conditions is: $CF_4$ is 80 sccm, $O_2$ is 20 sccm, pressure is 13 Pa, and applied power is 300 W, in the case of a 6-inch substrate.

Note that, in step 154, the etching gas causes the edge of the opening of the resist pattern 135 to further recede. With this receding, the edge of the opening of the third film 123 is also removed by etching. In this case, it is also possible to set the shape of the opening of the resist pattern 135 to a desired shape, to process the first film 121 to have a cross section (inner circumferential face) in a downward tapered shape.

Furthermore, the silicon oxide film has a great selectivity ratio (etching rate) with respect to the dry etching as illustrated in compared to the aluminum oxide film. Thus, as illustrated in FIG. 30, a cross sectional shape at the edge of the opening (inner circumferential face) of the first film 121 that is a silicon oxide film can be formed to be a shape close to a vertical face.

[3-4-5. Step 155]

Figure 31:
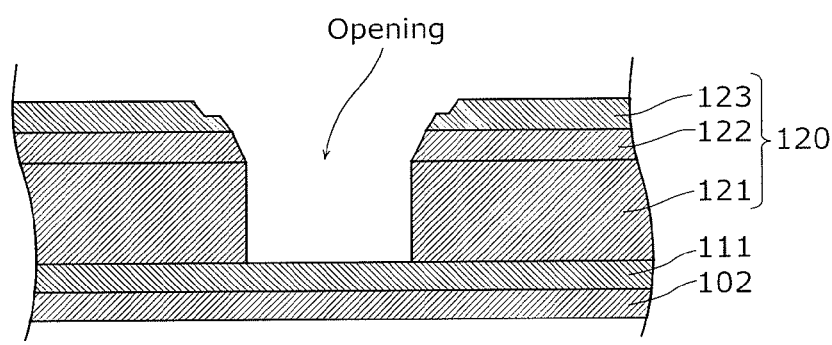
FIG. 31 is a schematic cross-sectional view after a removal of a resist in the formation process of the opening in the first insulating layer according to Embodiment 1.

As illustrated in FIG. 31, in step 155, the resist pattern 135 is removed. Specifically, removal by a chemical solution, removal by ashing using O₂ radical, or the like is employed. With the removal of the resist pattern 135, the opening can be formed in the first insulating layer 120.

[3-4-6. Step 156]

Figure 32:
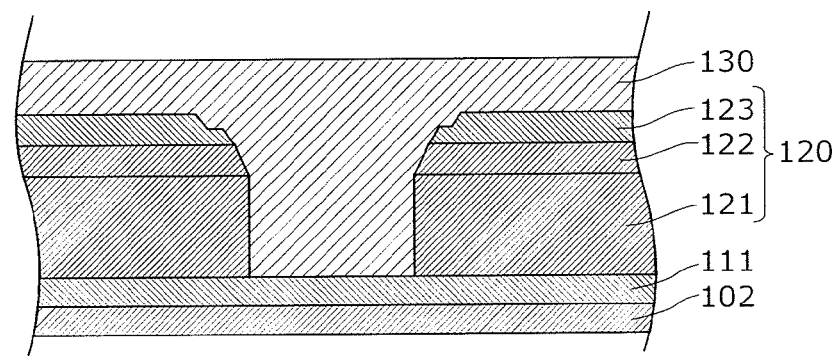
FIG. 32 is a schematic cross-sectional view illustrating a manufacturing step of forming the first electrode according to Embodiment 1.

Next, as illustrated in FIG. 32, in step 156, the first electrode 130 is provided. As illustrated in the drawing, the first electrode 130 is formed in the opening of the first insulating layer 120 to be connected to the semiconductor layer 111, and is also formed above a surface of the first insulating layer 120 (above an upper surface of the third film 123).

Specifically, first, a Cu film is deposited above the first insulating layer 120, filling the opening of the first insulating layer 120 by sputtering. The Cu film has a film thickness of, for example, approximately 100 nm to 300 nm. Next, the Cu film is processed into a predetermined pattern by photolithography and etching.

With this, the first electrode 130 processed into a predetermined shape is formed. Note that, the first insulating layer 120 has a function of insulating the semiconductor layer 111 and the first electrode 130.

3-5. Example

Figure 33:
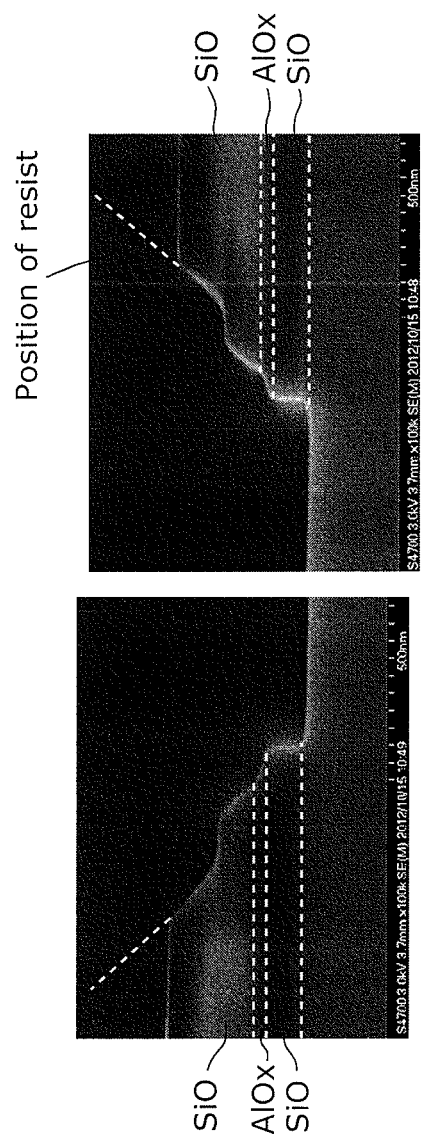
FIG. 33 is a SEM image showing a cross section of a periphery of the opening of a first opening according to Embodiment 1.

An opening is actually formed in the first insulating layer 120 with the above-described method, and a cross-sectional shape shown in FIG. 33 is achieved. Note that, in this Example, the first film 121 and the third film 123 are each a silicon oxide film and the second film 122 is an aluminum oxide film.

FIG. 33 shows that, although an aluminum oxide film is included as the first insulating layer 120, an opening having a desired shape can be formed using an alkaline solution.

4. Summary of Embodiment 1

As described above, in the method of manufacturing the TFT substrate 100 according to this embodiment, the first insulating layer 120 is used which has a stacked structure of (i) the first film 121, (ii) the second film 122 that is an aluminum oxide film, and (iii) the third film 123 that is a film including silicon, and when the opening is formed in the first insulating layer 120, the resist pattern 135 is formed above the third film 123, the third film 123 is processed by dry etching, and the second film 122 is processed by wet etching using an alkaline solution.

With the above-described method, even in the case where wet etching using the alkaline solution is performed on the first insulating layer 120 that includes the aluminum oxide, stripping of the resist pattern can be reduced. Thus, decrease in throughput during the processing of the first insulating layer 120 can be reduced. Thus, the TFT substrate 100 having a desired property can be realized.

Furthermore, although an alkaline solution is used as the etching solution in the method of manufacturing the TFT substrate 100 according to this Embodiment, a resist pattern may be formed above the second film 122 to be in contact with the second film 122 (e.g., aluminum oxide oxide film), and an acidic wet etching solution may be used. When wet etching is performed on the second film 122 using an acidic wet etching solution, stripping effect on the resist pattern is small unlike the case where an alkaline wet etching solution is used. However, even in this case, the above-described method can solve a problem that the second film 122 is etched by a stripping solution when a resist is stripped using an alkaline stripping solution (e.g., amine-based stripping solution).

Furthermore, in the method of manufacturing the TFT substrate 100 according to this embodiment, the manufacturing step of forming the opening in the first insulating layer 120 may further include a manufacturing step of processing the first film 121 by dry etching. In this case, in the manufacturing step in which the first film 121 is processed by dry etching, the first film 121 may be processed using, as a mask, the second film 122 that is an aluminum oxide film. With this, the opening shape of the second film 122 is transferred as the shape of the opening of the first insulating layer 120. Thus, with a setting of a size (opening size) of the opening of the second film 122, the opening of the first insulating layer 120 can be easily adjusted to a desired size (opening size).

Note that, the above-described method can be applied not only to the first insulating layer 120, but also to, for example, the protective layer 140 in the TFT substrate 100.

Furthermore, in the method of manufacturing the TFT substrate 100 in this embodiment, it may be that the first film 121 is a silicon oxide film, and the third film 123 includes at least one of a silicon oxide film, a silicon oxynitride film, or a silicon nitride film.

Furthermore, a method of manufacturing the organic EL display device 10 may be configured by including a manufacturing step (step 26) of forming, above the TFT substrate 100 manufactured according to the above-described method, the light-emitting layer 240 which emits light through recombination of an electron and a hole.

Embodiment 2

Next, Embodiment 2 is described. Note that, between Embodiment 2 and Embodiment 1, differences are mainly found in a cross-sectional shape of an opening of a first insulating layer 120 in a TFT substrate 100, and in a method of forming the opening, and other configurations are basically the same. Thus, this embodiment describes in the below mainly the first insulating layer 120 and a first electrode 130.

5. Details of First Insulating Layer 120 and First Electrode 130

5-1. Details of First Insulating Layer 120

Figure 34:
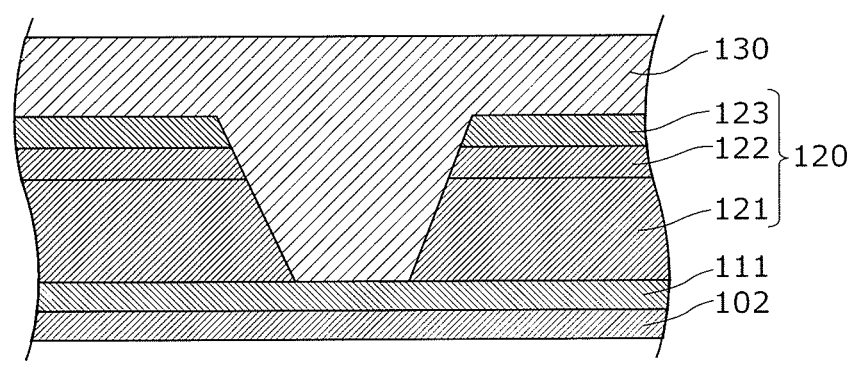
FIG. 34 is a schematic cross-sectional view of a periphery of an opening in a first insulating layer of a TFT substrate according to Embodiment 2.

The first insulating layer 120 in this embodiment is also formed to cover a semiconductor layer 111, and includes, as illustrated in FIG. 34, a first film 121 provided above the semiconductor layer 111, a second film 122 provided above the first film 121, and a third film 123 provided above the second film 122. The third film 123 is the topmost layer in the first insulating layer 120.

Similar to Embodiment 1, an opening is provided in a portion of the first insulating layer 120. However, the opening has a different cross-sectional shape. A method of processing the opening of the first insulating layer 120 will be described later in detail.

5-2. Formation Method of First Insulating Layer 120 (Step 14)

Figure 35:
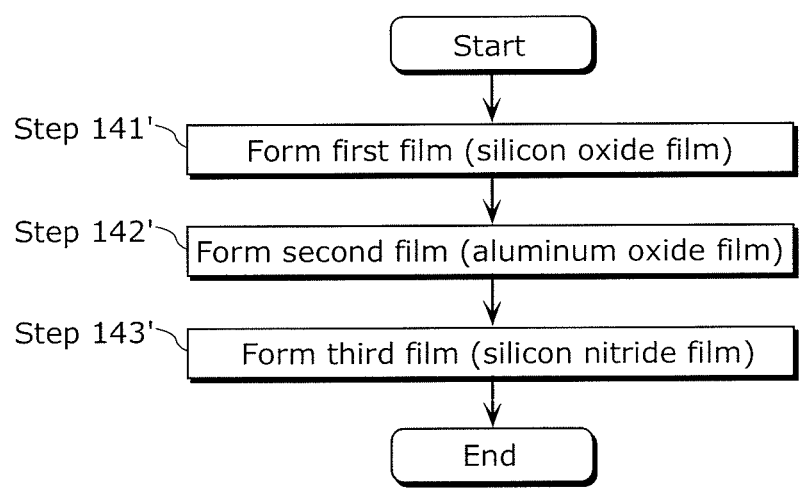
FIG. 35 is a formation flow diagram of the first insulating layer according to Embodiment 2.

As illustrated in FIG. 35, the first insulating layer 120 is formed, for example, by manufacturing steps of step 141' to step 143'. In this embodiment, a manufacturing step (step 14) of forming the first insulating layer 120 includes a manufacturing step (step 141') of forming the first film 121, a manufacturing step (step 142') of forming the second film 122, and a manufacturing step (step 143') of forming the third film 123.

[5-2-1. Step 141']

In step 141', the first film 121 is provided above the semiconductor layer 111. In this embodiment as well, for example, a silicon oxide film is used for the first film 121 to reduce damage to the semiconductor layer 111.

Similar to Embodiment 1, the silicon oxide film is formed using, for example, a parallel-plate type plasma CVD apparatus. Furthermore, it is preferable that the first film 121 have a film thickness of no less than 100 nm and no greater than 500 nm for the same reason as described in Embodiment 1.

Note that, the first film 121 is not limited to the silicon oxide film.

[5-2-2. Step 142']

In step 142', the second film 122 is provided above the first film 121. For example, an aluminum oxide film can be used as the second film 122.

Similar to Embodiment 1, the aluminum oxide film is formed using, for example, a reactive sputtering apparatus. Furthermore, it is preferable that the second film 122 have a film thickness of no less than 10 nm and no more than 50 nm, for the same reason as described in Embodiment 1. Furthermore, it is preferable that the second film 122 have a refractive index of approximately 1.60 to 1.65 with respect to light having a wavelength of 633 nm, for the same reason as described in Embodiment 1.

[5-2-3. Step 143']

In step 143', the third film 123 is provided above the second film 122. For example, a silicon nitride film is used for the third film 123. As described later, the third film 123 is processed by dry etching. When the third film 123 is a silicon nitride film, isotropic etching using a gas containing fluorine (F) can be performed.

The third film 123 is formed using, for example, a parallel-plate type plasma CVD apparatus. When the silicon nitride film is formed, the material includes, for example, SiH$_4$ and NH$_3$, or the like. Parameters, such as a gas flow rate, a pressure, applied power, a frequency, and the like, of the apparatus are appropriately set according to a substrate size, a film thickness setting, or the like.

It is preferable that the third film 123 have a film thickness of no less than 100 nm and no more than 500 nm. When the film thickness of the third film 123 is less than 100 nm, workability decreases. Specifically, the isotropic etching deteriorates when dry etching is performed on the third film 123. In other words, it becomes difficult to cause the third film 123 to recede by a process using the etching gas. On the other hand, when the film thickness of the third film 123 is more than 500 nm, throughput during the manufacturing decreases.

Furthermore, it is preferable that the third film 123 have a refractive index of no more than 1.89 with respect to light having a wavelength of 633 nm. When the refractive index is more than 1.89, workability on dry etching decreases.

Note that, the third film 123 is not limited to the silicon nitride film, but may be a silicon oxide film or the like. The silicon oxide film is formed using, for example, a parallel-plate type plasma CVD apparatus.

5-3. Details of Opening of First Insulating Layer 120 and First Electrode 130

As illustrated in FIG. 34, a part of the first insulating layer 120 is opened to form an opening in the first insulating layer 120. For example, the opening is formed in the first insulating layer 120 to form a contact portion between the semiconductor layer 111 and the first electrode 130. The opening is formed by processes in which a portion of each of the first film 121, the second film 122, and the third film 123 is removed.

The first electrode 130 is a metal film and is, for example, a Cu film. The first electrode 130 is continuously provided (i) in the opening of the first insulating layer 120 and (ii) above the first insulating layer 120. The first electrode 130 is formed, for example, above the first insulating layer 120, filling the opening of the first insulating layer 120.

5-4. Details of Formation Method of Opening in First Insulating Layer 120 and Formation Method of First Electrode 130

Figure 36:
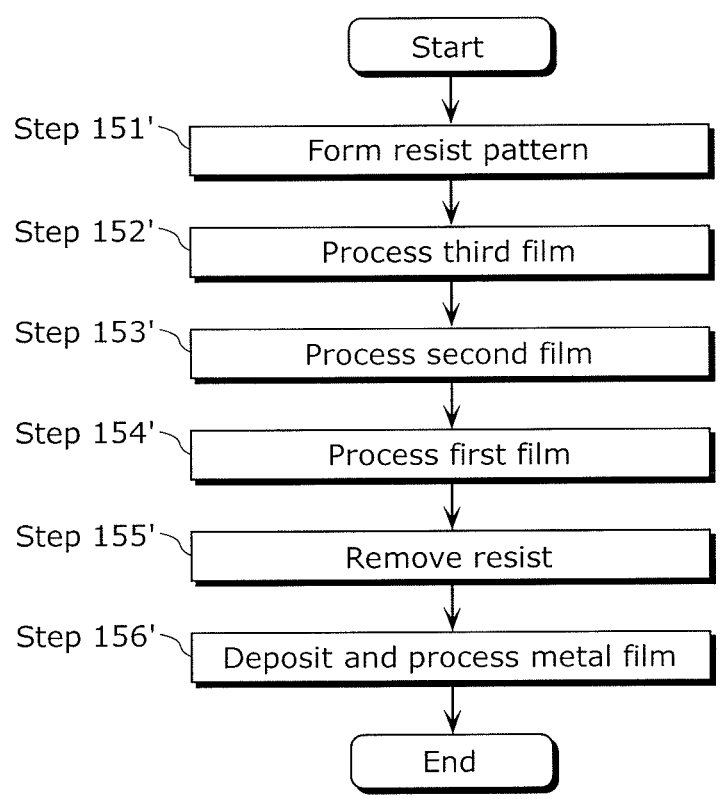
FIG. 36 is a formation flow diagram of (i) the opening in the first insulating layer and (ii) a first electrode according to Embodiment 2.

As illustrated in FIG. 36, the opening of the first insulating layer 120 and the first electrode 130 is formed, for example, by manufacturing steps of step 151' to step 156'.

Specifically, a manufacturing step of forming the opening in the first insulating layer 120 includes: a manufacturing step (step 151') of forming a resist pattern 135, a manufacturing step (step 152') of processing the third film 123, a manufacturing step (step 153') of processing the second film 122, a manufacturing step (step 154') of processing the first film 121; and a manufacturing step (step 155') of removing the resist pattern 135. Furthermore, a manufacturing step of forming the first electrode 130 is a manufacturing step (step 156') of depositing and processing a metal film.

[5-4-1. Step 151']

Figure 37:
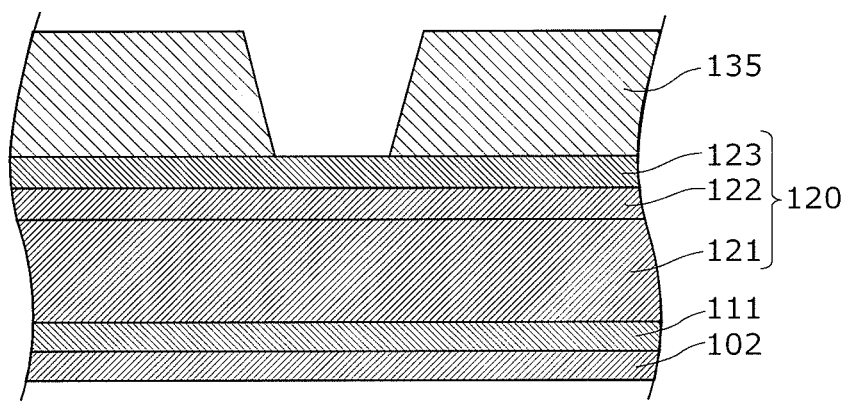
FIG. 37 is a schematic cross-sectional view after a formation of a resist pattern in a formation process of the opening in the first insulating layer according to Embodiment 2.

As illustrated in FIG. 37, in step 151', the resist pattern (resist film) 135 is formed above the first insulating layer 120. Specifically, a resist including a photosensitive resin material is applied to have a predetermined thickness above the first insulating layer 120. Next, the resist is exposed through a photomask that includes a pattern. Next, the resist is developed. With this, the resist pattern 135 in a predetermined shape is formed.

[5-4-2. Step 152']

Figure 38:
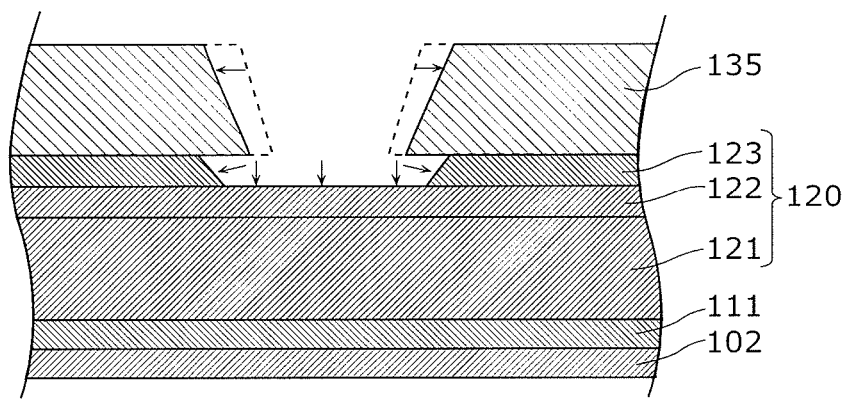
FIG. 38 is a schematic cross-sectional view after a third film is processed in the formation process of the opening in the first insulating layer according to Embodiment 2.

As illustrated in FIG. 38, in step 152', the third film 123 is processed. Specifically, dry etching is performed on the third film 123 that is a silicon nitride film. Due to the dry etching, the third film 123 in a layer under the opening of the resist pattern 135 is removed.

At this time, as illustrated in FIG. 38, a silicon nitride film having high reactivity to fluorine is used for the third film 123, and thus the third film 123 is also isotropically etched by the etching gas. With this, etching can be performed to achieve, in a cross-sectional shape (inner circumferential face) of the third film 123, a downward tapered shape. In other words, in this embodiment, anisotropy and isotropy by etching gas are controlled to achieve a downward tapered shape in a cross-sectional shape of the third film 123.

Furthermore, as illustrated in FIG. 38, the etching gas at this time causes the edge of the opening of the resist pattern 135 to recede to widen the opening compared to before the etching.

Note that, due to the difference between the etching rate of the resist pattern 135 and the etching rate of the third film 123, a shape is achieved in which an opening (opening size) of the third film 123 is wider than the opening (opening size) of the resist pattern 135.

Dry etching is performed using, for example, a reactive ion etching (RIE) apparatus. The etching gas includes, for example, sulfur hexafluoride ($SF_6$) and $O_2$. Parameters, such as a gas flow rate, a pressure, applied power, a frequency, and the like, of the apparatus are appropriately set according to a substrate size, etching quantity setting, or the like. An example of the etching conditions is: $SF_6$ is 70 sccm; $O_2$ is 30 sccm; pressure is 13 Pa; and applied power is 300 W, in the case of a 6-inch substrate.

[5-4-3. Step 153']

Figure 39:
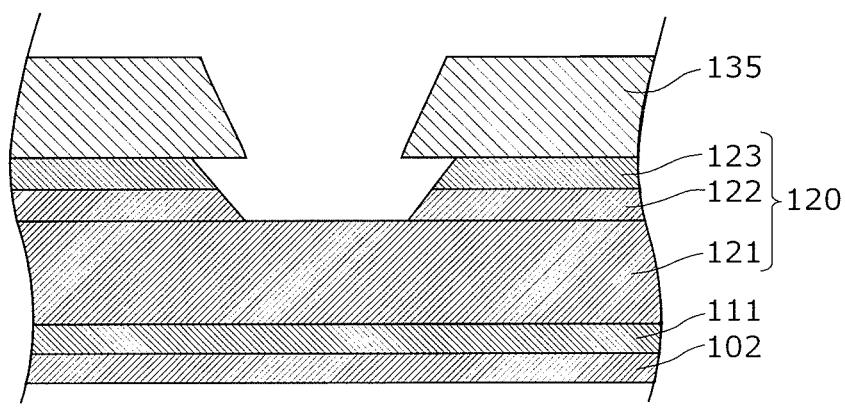
FIG. 39 is a schematic cross-sectional view after a second film is processed in the formation process of the opening in the first insulating layer according to Embodiment 2.

As illustrated in FIG. 39, in step 153', the second film 122 is processed. Specifically, wet etching is performed on the second film 122 that is an aluminum oxide film. At this time, instead of the resist pattern 135, the third film 123 serves as a mask pattern. The second film 122 in a layer under the opening of the third film 123 is removed by the wet etching.

At this time, the second film 122 is processed by the wet etching, and thus the second film 122 is isotropically etched by an etching solution. With this, etching can be performed to achieve a downward tapered shape in a cross-sectional (inner circumferential face) shape of the second film 122. Note that, in this embodiment, etching of the second film 122 is performed to match the inner circumferential face (sloped face) of the opening of the second film 122 with the inner circumferential face (sloped face) of the opening of the third film 123.

As the etching solution, an alkaline solution, such as a potassium hydroxide (KOH) solution, or the like, or an acid solution, such as a mixed acid solution or the like including a phosphoric acid, is used.

[5-4-4. Step 154']

Figure 40:
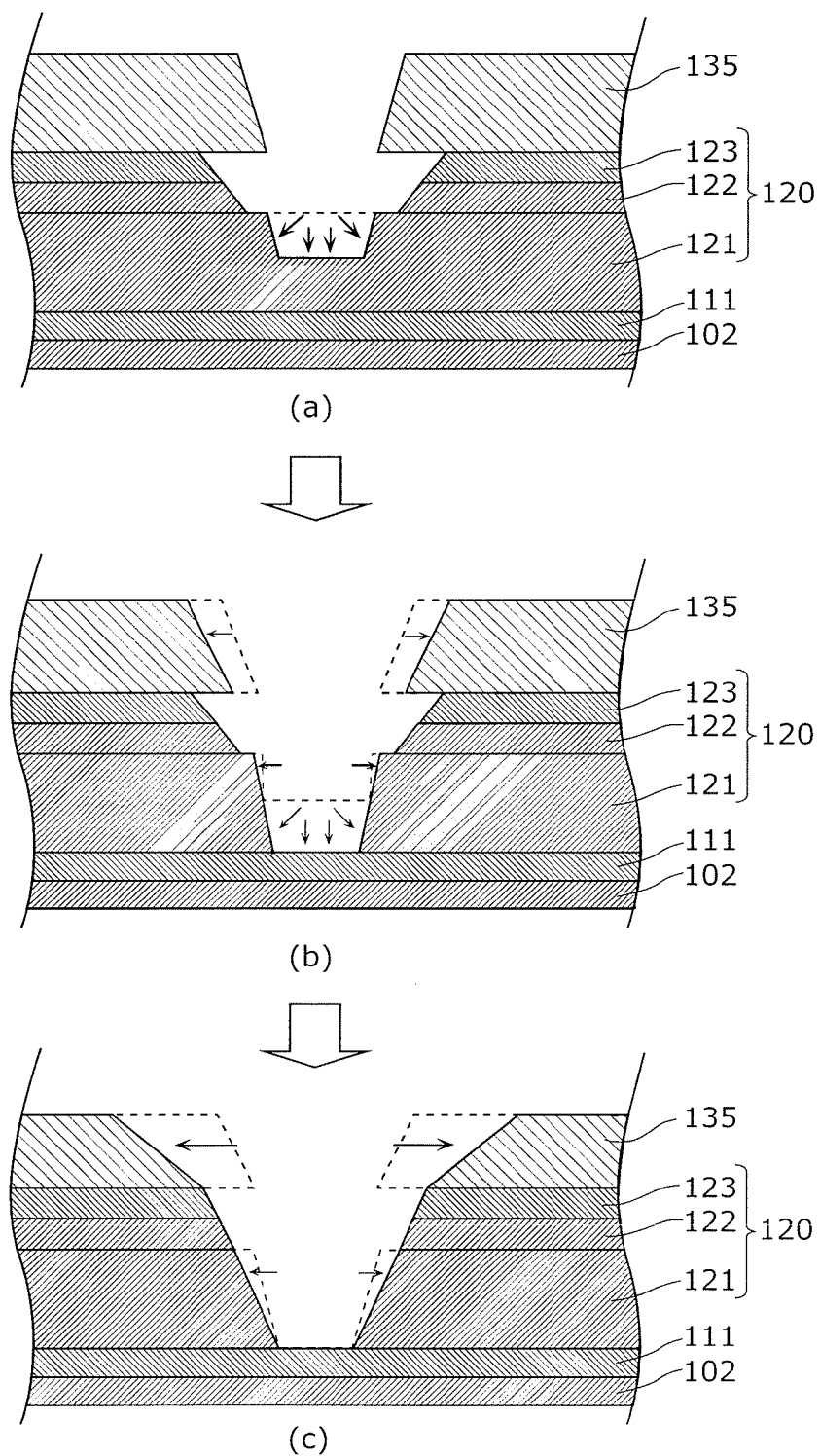
FIGS. 40 (a)-(c) show schematic cross-sectional views when a first film is processed in the formation process of the opening in the first insulating layer according to Embodiment 2.

As illustrated in FIG. 40, in step 154', the first film 121 is processed. Specifically, dry etching is performed on the first film 121 that is a silicon oxide film. Due to the dry etching, the first film 121 in a layer under the opening of the second film 122 is removed.

At this time, the etching gas etches the resist pattern 135 together with the first film 121. In other words, in step 154', receding of the resist pattern 135 occurs during the dry etching.

Specifically, as illustrated in (a) to (c) in FIG. 40, gradual receding occurs to the edge of the opening of the resist pattern 135 over processing time of the dry etching. With this, since the first film 121 is etched using the resist pattern 135 as a mask, an etched region of the first film 121 gradually widens with the receding of the resist pattern 135. As a result, etching can be performed to achieve a downward tapered shape in the cross-sectional (inner circumferential face) shape of the first film 121. Note that, in this embodiment, etching of the first film 121 is performed to match the inner circumferential face (sloped face) of the opening of the first film 121 with the inner circumferential face (sloped face) of the opening of the second film 122.

As described, in this embodiment, the first film 121 is processed using the resist pattern 135 as a mask, which is different from Embodiment 1. In other words, in this embodiment, a shape of the opening of the resist pattern 135 is transferred as a shape of the opening of the first film 121.

The dry etching may be performed, for example, using an RIE apparatus. The etching gas includes, for example, carbon tetrafluoride ($CF_4$) and $O_2$. Parameters, such as a gas flow rate, a pressure, applied power, a frequency, and the like, of the apparatus are appropriately set according to a substrate size, an etching quantity setting, or the like. An example of the etching conditions is: $CF_4$ is 80 sccm, $O_2$ is 20 sccm, pressure is 13 Pa, and applied power is 300 W, in the case of a 6-inch substrate.

[5-4-5. Step 155']

Figure 41:
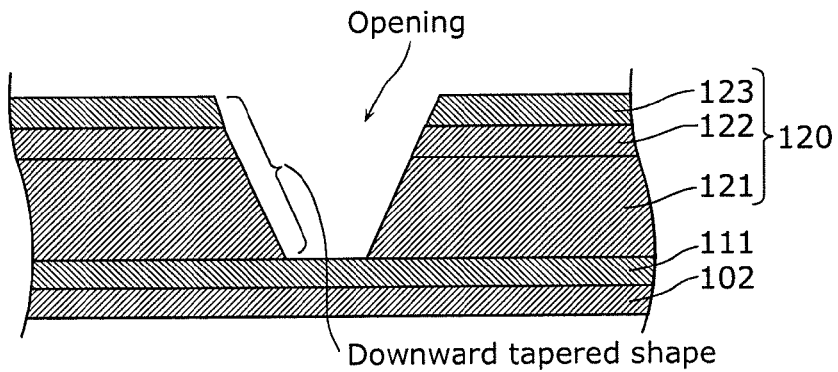
FIG. 41 is a schematic cross-sectional view after a removal of a resist in the formation process of the opening in the first insulating layer according to Embodiment 2.

As illustrated in FIG. 41, in step 155', the resist pattern 135 is removed. Specifically, removal by a chemical solution, removal by ashing using $O_2$ radical, or the like is employed. With the removal of the resist pattern 135, an opening is formed which is in a downward tapered shape in a cross section of the first insulating layer 120.

[5-4-6. Step 156']

Figure 42:
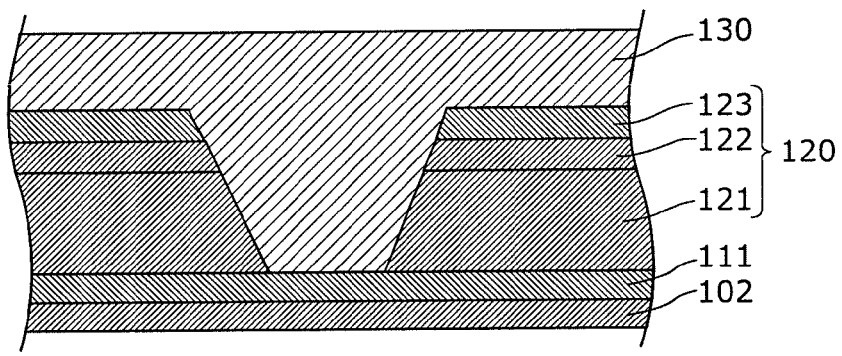
FIG. 42 is a schematic cross-sectional view illustrating a manufacturing step of forming the first electrode according to Embodiment 2.

Next, as illustrated in FIG. 42, in step 156', the first electrode 130 is provided. As illustrated in the drawing, the first electrode 130 is formed in the opening of the first insulating layer 120 to be connected to the semiconductor layer 111, and is also formed above a surface of the first insulating layer 120 (above an upper surface of the third film 123).

Specifically, first, a Cu film is deposited above the first insulating layer 120, filling the opening of the first insulating layer 120 by sputtering. The Cu film has a film thickness of, for example, approximately 100 nm to 300 nm. Next, the Cu film is processed into a predetermined pattern by photolithography and etching.

With this, the first electrode 130 processed into a predetermined shape is formed. Note that, the first insulating layer 120 has a function of insulating the semiconductor layer 111 and the first electrode 130.

6. Summary of Embodiment 2

As described above, the TFT substrate 100 according to this embodiment includes the first insulating layer 120 in which the first film 121, the second film 122, and the third film 123 are stacked, and the opening provided in the first insulating layer 120 has a downward tapered shape at least in a cross section of the topmost layer (the third film 123).

With the above-described configuration, the cross section of the opening of the first insulating layer 120 has an obtuse angle at an upper end portion. In other words, the angle formed between the surface of the first insulating layer 120 and an inner face of the opening becomes an obtuse angle. As a result, when the first electrode 130 is formed which is continuous from the inside of the opening of the first insulating layer 120 to the surface of the first insulating layer 120, coverage of an opening edge portion of the first insulating layer 120 with the first electrode 130 is further improved. Thus, occurrence of breakage of the first electrode 130 at the opening edge portion of the first insulating layer 120 can be reduced. Thus, the TFT substrate 100 having a desired property can be provided.

Furthermore, in the TFT substrate 100 according to this embodiment, cross sections of the second film 122 and the third film 123 at the opening also have downward tapered shapes. With this, occurrence of breakage of the first electrode 130 at the opening edge portion of the first insulating layer 120 can be further reduced.

Note that, the above-described configuration is applicable not only to the first insulating layer 120, but also to a protective layer 140 in the TFT substrate 100, for example.

Furthermore, in the TFT substrate 100 according to this embodiment, the first film 121 may be a silicon oxide film, the second film 122 may be an aluminum oxide film, and the third film 123 may be a silicon nitride film. With this, processing can be performed more easily to achieve a downward tapered shape at the opening in a cross section. Note that, the materials of the first film 121, the second film 122, and the third film 123 are not limited to the above-described materials.

Furthermore, an organic EL display device 10 may be configured by including: the TFT substrate 100 having the above-described configuration; and a light-emitting layer 240 which emits light through recombination of an electron and a hole.

Furthermore, in the method of manufacturing the TFT substrate 100 according to this embodiment, the first insulating layer 120 is used which is a stacked film of the first film 121, the second film 122, and the third film 123, and the manufacturing steps of forming the opening in the first insulating layer 120 includes formation of the resist pattern 135 above the third film 123, processing the third film 123 by dry etching, processing the second film 122 by wet etching, and processing the first film 121 by dry etching, and thus the opening has a downward tapered shape in a cross section of the topmost layer (the third film 123).

With the above-described method, an upper edge portion of the opening in a cross section of the first insulating layer 120 can achieve an obtuse angle. With this, coverage of the opening edge portion with the first electrode 130 further improves, and thus the occurrence of breakage of the first electrode 130 at the opening edge portion can be reduced. Thus, the TFT substrate 100 having a desired property can be provided.

Furthermore, in the method of manufacturing the TFT substrate 100 according to this Embodiment, the second film 122 and the third film 123 are processed to provide openings that also have downward tapered shapes in cross sections of the second film 122 and the third film 123. With this, occurrence of breakage of the first electrode 130 at the opening edge portion of the first insulating layer 120 can be further reduced.

Furthermore, in the method of manufacturing the TFT substrate 100 according to this embodiment, in the manufacturing step of processing the first film 121 by dry etching, the first film 121 is processed using the resist pattern 135 as a mask. With this, an opening shape of the resist pattern 135 is transferred as a shape of the opening of the first film 121. Thus, a size of the opening (opening size) of the first insulating layer 120 can be set with a mask pattern of the resist pattern 135.

Furthermore, the method of manufacturing the TFT substrate 100 according to this embodiment utilizes the receding of the opening of the resist pattern 135 during the dry etching, to allow the opening to have a downward tapered shape in a cross section of the first film 121. With this, a downward taper structure can be provided in a cross section of the opening without unnecessarily increasing the opening size of the opening (i.e., without significantly widening the opening relative to the mask). Thus, occurrence of the breakage of the first electrode 130 at the opening edge portion can be further reduced.

Note that, the above-described method can be applied not only to the first insulating layer 120, but can also be applied to, for example, the protective layer 140 in the TFT substrate 100.

Furthermore, the first film 121 may be a silicon oxide film, the second film 122 may be an aluminum oxide film, and the third film 123 may be a silicon nitride film. With this, the opening can be more easily processed to have a tapered shape in cross section. Note that, materials of the first film 121, the second film 122, and the third film 123 are not limited to the above-described materials.

Furthermore, the method of manufacturing the organic EL display device 10 may be configured by including a manufacturing step of forming, above the TFT substrate 100 manufactured according to the above-described method, the light-emitting layer 240 which emits light through recombination of an electron and a hole.

Modification of Embodiment 2

Next, a modification of Embodiment 2 is described. Note that, this modification and Embodiment 2 are different mainly in a structure of a third film 123 in a first insulating layer in a TFT substrate 100. Except for this difference, this modification and Embodiment 2 have basically the same configuration. Thus, in the below, this modification mainly describes a first insulating layer 120A and a first electrode 130.

7. Details of First Insulating Layer 120A and First Electrode 130

7-1. Details of First Insulating Layer 120A

Figure 43:
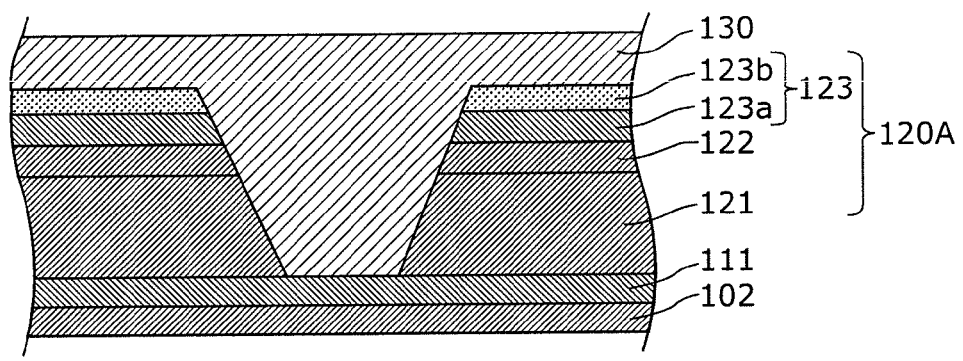
FIG. 43 is a schematic cross-sectional view of a periphery of an opening in a first insulating layer of a TFT substrate according to a modification of Embodiment 2.

In this modification, the third film 123 that is the topmost layer of the first insulating layer 120A has a two-layer structure. Specifically, as illustrated in FIG. 43, the first insulating layer 120A includes a first film 121 provided above a semiconductor layer 111, a second film 122 provided above the first film 121, and the third film 123 provided above the second film 122. The third film 123 includes a plurality of layers having different film properties.

The third film 123 according to this modification includes a first layer 123a, and a second layer 123b provided above the first layer 123a. Furthermore, the first layer 123a and the second layer 123b are formed using a same material, but have different film densities. The second layer 123b has a film density lower than a film density of the first layer 123a. In other words, a film structure of the first layer 123a is relatively dense compared to the second layer 123b. On the other hand, a film structure of the second layer 123b is relatively sparse compared to the first layer 123a.

Furthermore, similar to Embodiment 2, an opening is provided in a portion of the first insulating layer 120A. The method of processing the opening of the first insulating layer 120A will be described later in detail.

7-2. Formation Method of First Insulating Layer 120A

Similar to Embodiment 2, the first insulating layer 120A is formed by the manufacturing steps of step 141' to step 143'.

[7-2-1. Step 141']

Step 141' in this modification is the same as step 141' in Embodiment 2. The first film 121 is, for example, a silicon oxide film.

[7-2-2. Step 142']

Step 142' in this modification is the same as step 142' in Embodiment 2. The second film 122 is, for example, an aluminum oxide film.

[7-2-3. Step 143']

In step 143', the third film 123 is provided above the second film 122. The third film 123 in this modification includes a plurality of layers having different film densities. For example, a silicon nitride film is used for the third film 123.

The third film 123 in which film densities are different is formed using, for example, a parallel-plate type plasma CVD apparatus. In this case, the material for forming a silicon nitride film as the third film 123 includes, for example, $SiH_4$ and $NH_3$, or the like. Parameters, such as a gas flow rate, a pressure, applied power, a frequency, and the like, of the apparatus are appropriately set according to a substrate size, a film thickness setting, or the like.

For example, a silicon nitride film including a plurality of layers having different film densities can be formed by changing the above-described film formation condition during the formation of the silicon nitride film. In this modification, a film formation rate is changed once to form two layers, that is, the first layer 123a that is a silicon nitride film layer having a relatively high film density and the second layer 123b that is a silicon nitride film layer having a relatively low film density.

It is preferable that the third film 123 has a film thickness of no less than 100 nm and no more than 500 nm in total including the first layer 123a and the second layer 123b.

7-3. Details of Opening of First Insulating Layer 120A and First Electrode 130

As illustrated in FIG. 43, similar to Embodiment 2, a portion of the first insulating layer 120A is opened to form an opening in the first insulating layer 120A. The opening is formed by processing the first film 121, the second film 122, and the third film 123.

Similar to Embodiment 2, a first electrode 130 is a metal film, such as a Cu film. The first electrode 130 is formed above the first insulating layer 120A, filling the opening of the first insulating layer 120A.

7-4. Details of Formation Method of Opening in First Insulating Layer 120A and Formation Method of First Electrode 130

The opening of the first insulating layer 120A and the first electrode 130 are formed by, similar to Embodiment 2, manufacturing processes of step 151' to step 156'.

[7-4-1. Step 151']

Figure 44:
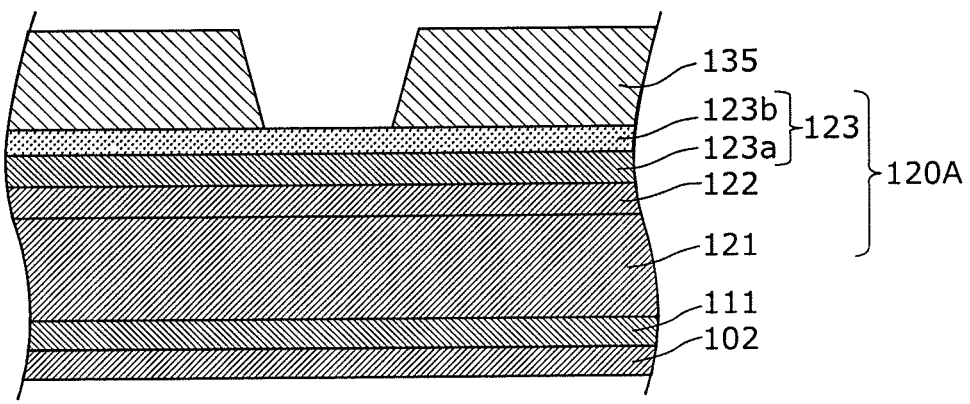
FIG. 44 is a schematic cross-sectional view after a formation of a resist pattern in a formation process of the opening in the first insulating layer according to the modification of Embodiment 2.

As illustrated in FIG. 44, in step 151', a resist pattern (resist film) 135 is formed above the first insulating layer 120A in a similar manner as in Embodiment 2.

[7-4-2. Step 152']

Figure 45:
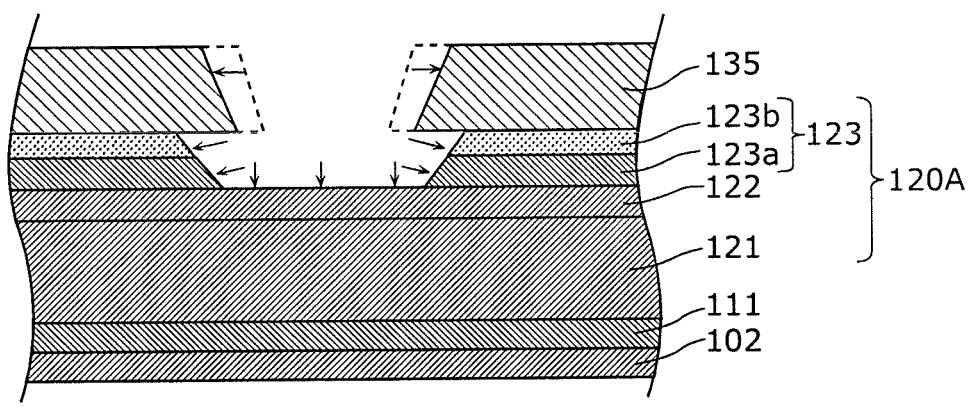
FIG. 45 is a schematic cross-sectional view after a fourth film and a third film are processed in the formation process of the opening in the first insulating layer according to the modification of Embodiment 2.

As illustrated in FIG. 45, in step 152', the third film 123 is processed. Specifically, dry etching is performed on the third film 123. Due to the dry etching, the third film 123 in a layer under the opening of the resist pattern 135 is removed.

At this time, in this modification, the third film 123 includes silicon nitride films, that is, the first layer 123a and the second layer 123b having different film densities. The second layer 123b that is an upper layer has a film density lower than a film density of the first layer 123a that is a lower layer. With this, it is possible to ensure that the second layer 123b that is the upper layer has an etching rate greater than an etching rate of the first layer 123a that is the lower layer. Thus, the third film 123 can be isotropically etched with ease. Thus, compared to Embodiment 2, the third film 123 can easily achieve a downward tapered shape in cross sectional shape.

Note that, it is preferable that the second layer 123b have an etching rate at least twice an etching rate of the first layer 123a. With this, more isotropical etching can be performed on the third film 123, and thus the third film 123 can easily achieve a downward tapered shape in a cross-sectional shape.

Furthermore, in this modification as well, as illustrated in FIG. 45, the etching gas causes the edge of the opening of the resist pattern 135 to recede to widen the opening compared to before the etching.

Dry etching is performed using, for example, a reactive ion etching (RIE) apparatus. The etching gas includes, for example, sulfur hexafluoride ($SF_6$) and $O_2$. Parameters, such as a gas flow rate, a pressure, applied power, a frequency, and the like, of the apparatus are appropriately set according to a substrate size, etching quantity setting, or the like. An example of the etching conditions is: $SF_6$ is 70 sccm; $O_2$ is 30 sccm; pressure is 13 Pa; and applied power is 300 W, in the case of a 6-inch substrate.

[7-4-3. Step 153']

Figure 46:
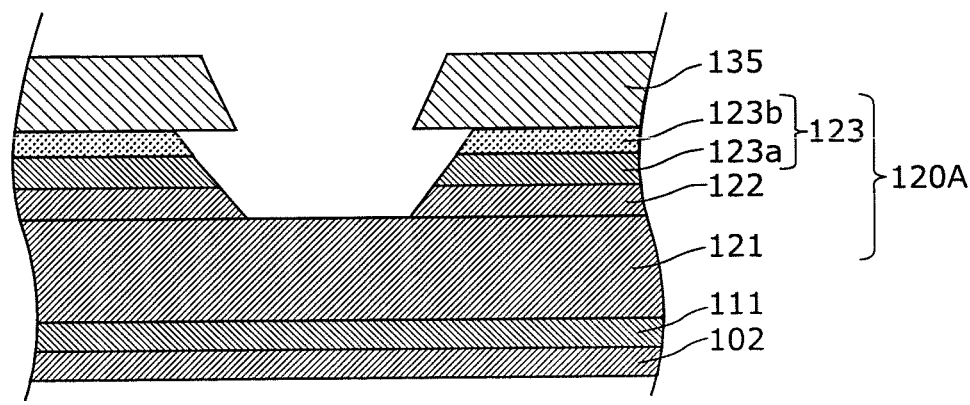
FIG. 46 is a schematic cross-sectional view after a second film is processed in the formation process of the opening in the first insulating layer according to the modification of Embodiment 2.

As illustrated in FIG. 46, in step 153', the second film 122 is processed in a similar manner as in Embodiment 2. Specifically, wet etching is performed on the second film 122 that is an aluminum oxide film, to remove the second film 122 in a layer under the opening of the third film 123. With this, the second film 122 can be etched to have a downward tapered shape in cross sectional shape. The etching solution is not limited to an alkaline solution such as a potassium hydroxide (KOH) solution or the like, but an acid solution such as a mixed acid solution or the like including a phosphoric acid are used.

[7-4-4. Step 154']

Figure 47:
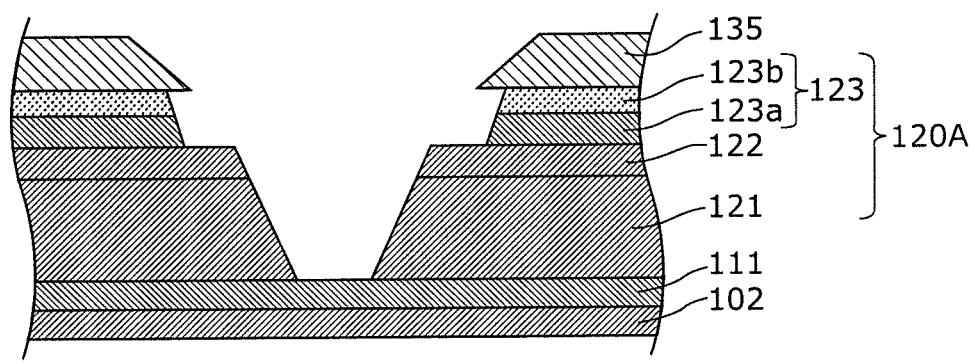
FIG. 47 is a schematic cross-sectional view after a first film is processed in the formation process of the opening in the first insulating layer according to the modification of Embodiment 2.

As illustrated in FIG. 47, in step 154', the first film 121 is processed in a similar manner as in Embodiment 2. Specifically, dry etching is performed on the first film 121 that is a silicon oxide film to remove the first film 121 in a layer under the opening of the second film 122.

In this modification as well, the edge of the opening of the resist pattern 135 is caused to gradually recede over processing time of the dry etching, and the etched region of the first film 121 gradually widens with the receding of the resist pattern 135. Thus, a downward tapered shape can be formed in a cross section of the first film 121. As described, in this modification as well, the first film 121 is processed using the resist pattern 135 as a mask.

The dry etching is performed using, for example, an RIE apparatus. The etching gas includes, for example, carbon tetrafluoride ($CF_4$) and $O_2$. An example of the etching conditions is: $CF_4$ is 80 sccm; $O_2$ is 20 sccm, pressure is 13 Pa, and applied power is 300 W, in the case of a 6-inch substrate.

[7-4-5. Step 155']

Figure 48:
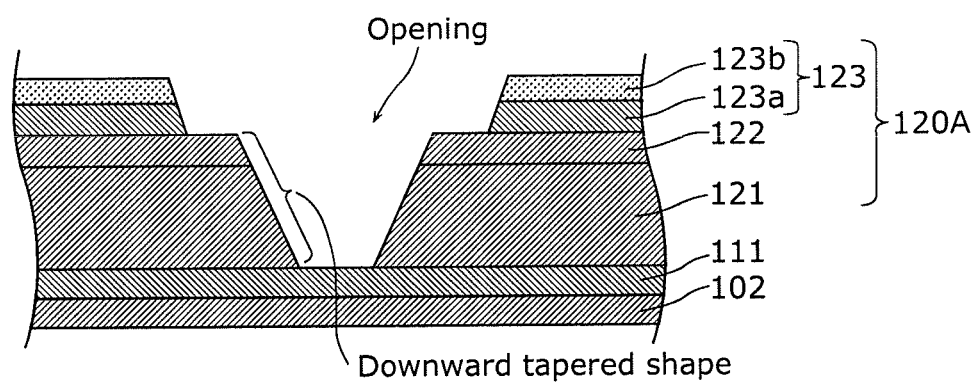
FIG. 48 is a schematic cross-sectional view after a removal of a resist in the formation process of the opening in the first insulating layer according to the modification of Embodiment 2.

As illustrated in FIG. 48, in step 155', the resist pattern 135 is removed in a similar manner as in Embodiment 2. Thus, an opening is formed which is in a downward tapered shape in a cross section of the first insulating layer 120A.

[7-4-6. Step 156']

Figure 49:
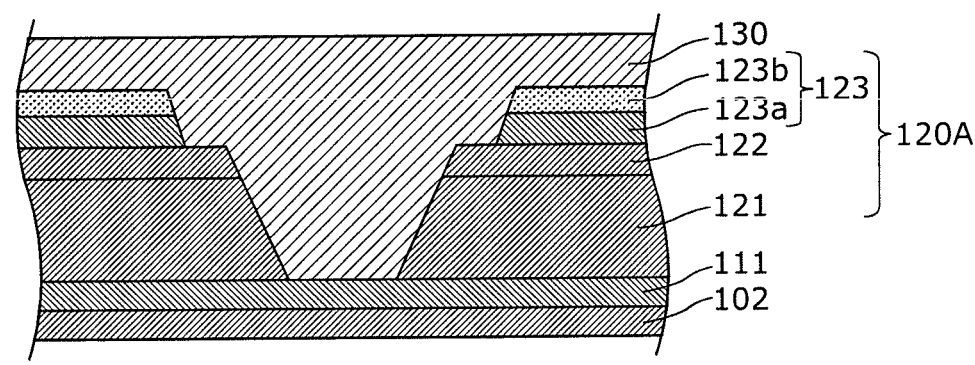
FIG. 49 is a schematic cross-sectional view illustrating a manufacturing step of forming the first electrode according to the modification of Embodiment 2.

Next, as illustrated in FIG. 49, in step 156', the first electrode 130 including a Cu film processed into a predetermined shape is provided in a similar manner as in Embodiment 2.

7-5. Example

Figure 50:
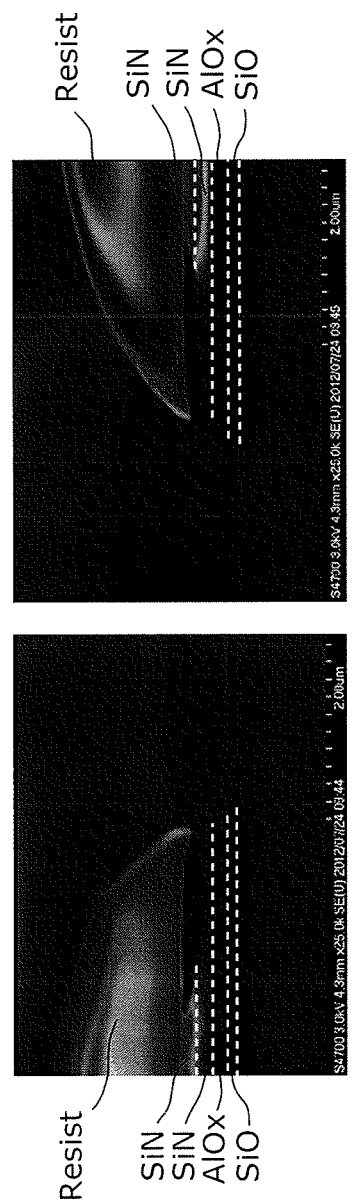
FIG. 50 is a SEM image showing a cross section of a periphery of an opening of a first opening according to an Example of Embodiment 2.

An opening is actually formed in the first insulating layer 120A with the above-described method. FIG. 50 shows an obtained cross sectional shape. Note that, in this Example, the first film 121 has a single layer that is a silicon oxide film, the second film 122 has a single layer that is an aluminum oxide film, and the third film 123 has two layers that are the first layer 123a and the second layer 123b having different film densities. Furthermore, FIG. 50 is a drawing which corresponds to FIG. 47, and shows a state before the removal of the resist pattern 135.

FIG. 50 shows that a desired opening which is in a downward tapered shape in cross section is formed in the first insulating layer 120A.

8. Summary of Modification of Embodiment 2

As above, in the TFT substrate 100 according to this modification, similar to Embodiment 2, the opening provided in the first insulating layer 120A has a downward tapered shape at least in a cross section of the topmost layer (the third film 123).

With the above-described configuration, the upper end portion of the opening becomes an obtuse angle in a cross section of the first insulating layer 120A. Thus, occurrence of breakage of the first electrode 130 at the opening edge portion can be reduced. Thus, the TFT substrate 100 having a desired property can be provided.

Furthermore, in this modification, the third film 123 includes the first layer 123a and the second layer 123b which are formed from a same material, and the second layer 123b has a film density lower than a film density of the first layer 123a.

With this configuration, compared to Embodiment 2, a downward tapered shape can be achieved in cross sectional shape of the third film 123 more easily.

Furthermore, in the TFT substrate 100 in this modification as well, the openings in the second film 122 and the third film 123 have downward tapered shapes in cross section. With this, occurrence of breakage of the first electrode 130 at the opening edge portion can be further reduced.

Note that, in this modification as well, the above-described configuration can be applied to a protective layer 140.

Furthermore, in this modification as well, the first film 121 may be a silicon oxide film, the second film 122 may be an aluminum oxide film, and the third film 123 may be a silicon nitride film. With this, the opening can be more easily processed into a downward tapered shape in cross section. Note that, materials of the first film 121, the second film 122, and the third film 123 are not limited to the above-described materials.

Furthermore, an organic EL display device 10 may be configured by including: the TFT substrate 100 having the above-described configuration; and a light-emitting layer 240 which emits light through recombination of an electron and a hole.

Furthermore, in the method of manufacturing the TFT substrate 100 according to this modification, similar to Embodiment 2, in a manufacturing step of forming the opening in the first insulating layer 120A, the resist pattern 135 is formed above the third film 123, the third film 123 is processed by dry etching, the second film 122 is processed by wet etching, and the first film 121 is processed by dry etching, and thus the opening has a downward tapered shape in a cross section of the topmost layer (the third film 123) of the first insulating layer 120A.

With the above-described method, an upper end portion of the opening in a cross section of the first insulating layer 120A can achieve an obtuse angle. Thus, occurrence of breakage of the first electrode 130 at the opening edge portion can be reduced. Thus, the TFT substrate 100 having a desired property can be provided.

Furthermore, in this modification, the third film 123 includes the first layer 123a and the second layer 123b which are formed from a same material, and the second layer 123b has a film density lower than a film density of the first layer 123a.

With this configuration, it is possible to ensure that the second layer 123b has an etching rate greater than an etching rate of the first layer 123a when dry etching is performed on the third film 123. Thus, the third film 123 can be isotropically etched with ease. Thus, compared to Embodiment 2, the third film 123 can easily achieve a downward tapered shape in cross sectional shape.

Furthermore, in the method of manufacturing the TFT substrate 100 according to this modification, it is preferable that the second layer 123b have an etching rate at least twice an etching rate of the first layer 123a in a manufacturing step of processing the third film 123 by dry etching. With this, more isotropical etching can be performed on the third film 123, and thus the third film 123 can easily achieve a downward tapered shape in a cross-sectional shape.

Furthermore, in this modification as well, the first film 121 is processed using the resist pattern 135 as a mask. Thus, a size of the opening (opening size) of the first insulating layer 120 can be set with the mask pattern of the resist pattern 135.

Furthermore, this modification also utilizes the receding of the opening of the resist pattern 135 during the dry etching, to allow the opening to have a downward tapered shape in a cross section of the first film 121. With this, a downward taper structure can be provided in the cross section of the opening without unnecessarily increasing the opening size of the opening. Thus, occurrence of the breakage of the first electrode 130 at the opening edge portion can be further reduced.

Note that, in this modification as well, the above-described method can be applied not only to the first insulating layer 120A, but can also be applied to, for example, the protective layer 140 in the TFT substrate 100.

Furthermore, in this modification as well, the first film 121 may be a silicon oxide film, the second film 122 may be an aluminum oxide film, and the third film 123 may be a silicon nitride film. With this, the opening can be more easily processed to have a tapered shape in cross section. Note that, materials of the first film 121, the second film 122, and the third film 123 are not limited to the above-described materials.

Furthermore, in this modification as well, the method of manufacturing the organic EL display device 10 may be configured by including a manufacturing step of forming, above the TFT substrate 100 manufactured according to the above-described method, the light-emitting layer 240 which emits light through recombination of an electron and a hole.

(Other Modifications)

A TFT substrate, a TFT substrate manufacturing method, an organic EL display device, and an organic EL display device manufacturing method have thus far been described based on embodiments and modifications. However, the present invention is not limited to the above-described embodiments and modifications.

Figure 51:
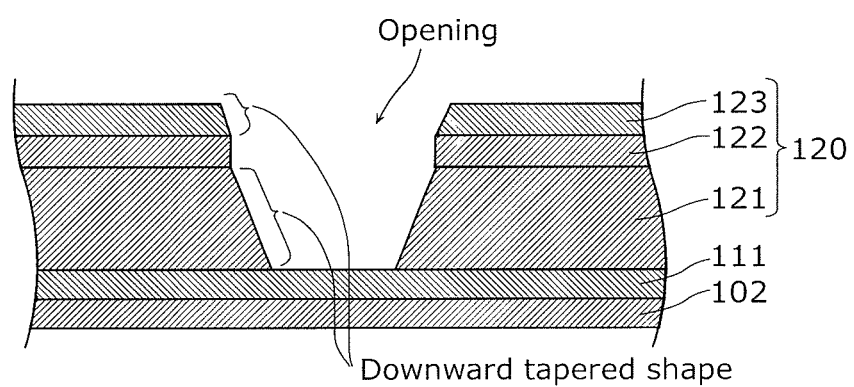
FIG. 51 is a schematic cross-sectional view of a periphery of an opening in a first insulating layer according to another modification of Embodiment 2.

For example, in the above-described Embodiment 2, the opening is formed so that the opening has a downward tapered shape in a cross section of each of the first film 121, the second film 122, and the third film 123. However, breakage of the first electrode 130 can be reduced as long as the opening is in a downward tapered shape at least in the cross section of the topmost layer (the third film 123). For example, as illustrated in FIG. 51, the first film 121 and the third film 123 may have downward tapered shapes in cross sectional shape. Furthermore, the second film 122 and the third film 123 may have downward tapered shapes in cross sectional shape.

Furthermore, in the above-described Embodiment 2, etching is performed so that inner circumferential faces (sloped faces) of the openings of the first film 121, the second film 122, and the third film 123 become flush with each other. However, the openings may be formed to include a step between the films. Note that, reducing the step between films as much as possible so that inner circumferential faces (sloped faces) of the films become flush with each other is more effective in reducing breakage of the first electrode 130 at the opening.

Furthermore, the third film 123 has a two-layer structure in the above-described Embodiment 2, but is not limited thereto. For example, the third film 123 may include a plurality of layers of three or more layers. In this case, an upper layer film may have a lower film density than the underlying layer. Alternatively, a fourth film which has an etching rate greater than an etching rate of the third film 123 may be formed above the third film 123. With this, the opening which has a downward tapered shape in cross section can be formed in the first insulating layer 120A.

Figure 52:
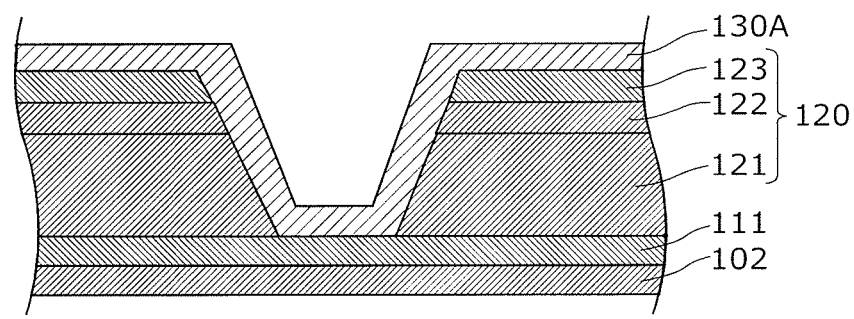
FIG. 52 is a schematic cross-sectional view of a first electrode according to a modification.

Furthermore, in the above-described Embodiment 1, Embodiment 2, and modifications, the first electrode 130 is formed to fill the first insulating layer 120 and the first insulating layer 120A, but is not limited thereto. For example, as illustrated in FIG. 52, a first electrode 130A may be formed to have a constant film thickness throughout above the inner face and above the base of the opening of the first insulating layer 120 and above the surface of the first insulating layer 120.

Furthermore, a cross section (inner circumferential face) of the opening of the resist pattern 135 is a tapered face (sloped face) in the above-described Embodiment 1, Embodiment 2, and modifications, but is not limited thereto. For example, even when a cross section (inner circumferential face) of the opening of the resist pattern 135 is a vertical face, advantageous effects of Embodiments 1 and 2 can be produced.

Moreover, embodiments obtained through various modifications to the above embodiments and modifications which may be conceived by a person skilled in the art as well as embodiments realized by arbitrarily combining the structural elements and functions of the embodiments and the modifications without materially departing from the principles and spirit of the present invention are included in the present invention.

INDUSTRIAL APPLICABILITY

A technique disclosed here can be applied to a TFT substrate used in the display device or to an organic EL display device or the like that is driven by a TFT substrate.

REFERENCE SIGNS LIST

10 Organic EL display device
20 Attaching layer
100 TFT substrate
101 Gate electrode
102 Gate insulating film
110 Glass substrate
111 Semiconductor layer
120, 120A First insulating layer
121 First film
122 Second film
123 Third film
123*a* First layer
123*b* Second layer
130, 130A First electrode
135 Resist pattern
140 Protective layer
141 First protective layer
142 Second protective layer
150 Second electrode
151 Lower layer electrode
152 Upper layer electrode
161 Second insulating layer
170 TFT unit
171 Switching TFT
172 Drive TFT
180 Gate line
190 Source line
200 EL device unit
201 Planarizing layer
210 Anode
211 Lower layer anode
212 Upper layer anode
220 Bank
231 Hole injection layer
232 Electron blocking layer
240 Light-emitting layer
241 Red-light-emitting layer
242 Green-light-emitting layer
243 Blue-light-emitting layer
251 Electron injection layer
260 Cathode
270 Sealing layer
300 Color filter substrate
310 Glass substrate
320 Filter
321 Red filter
322 Green filter
323 Blue filter

The invention claimed is:

1. A method of manufacturing a thin film transistor (TFT) substrate in which a TFT including an oxide semiconductor layer is formed, the method comprising:
    forming an insulating layer to cover the oxide semiconductor layer; and
    forming an opening in the insulating layer,
    wherein the insulating layer includes a first film, a second film which is provided above the first film and is an aluminum oxide film, and a third film which is provided above the second film and is a film including silicon,
    the forming of the opening includes:
        forming a resist pattern above the third film;
        processing the third film by dry etching; and
        processing the second film by wet etching, and
    the opening comprises a through-hole in each of the first film, the second film, and the third film.

2. The method according to claim 1,
    wherein an alkaline solution is used in the processing of the second film.

3. The method according to claim 1,
    wherein the forming of the opening further includes processing the first film by dry etching.

4. The method according to claim 3,
    wherein the second film is used as a mask in the processing of the first film.

5. The method according to claim 1,
wherein the first film is a silicon oxide film, and
the third film includes at least one of a silicon oxide film, a silicon oxynitride film, or a silicon nitride film.

6. A method of manufacturing an organic EL display device, the method comprising
forming, above the TFT substrate manufactured using the method according to claim 1, a light-emitting layer which emits light through recombination of an electron and a hole.

7. A method of manufacturing a TFT substrate, the method comprising:
forming an insulating layer;
forming an opening in the insulating layer; and
continuously forming an electrode in the opening and above the insulating layer,
wherein the forming of the insulating layer includes:
forming a first film;
forming a second film above the first film; and
forming a third film above the second film,
the forming of the opening includes:
forming a resist pattern above the third film;
processing the third film by dry etching;
processing the second film by wet etching; and
processing the first film by dry etching, and
in the processing of the third film, the opening is formed to have a downward tapered shape in a cross section of the third film.

8. The method according to claim 7,
wherein in the processing of the first film, the opening is formed to have a downward tapered shape in a cross section of the first film.

9. The method according to claim 7,
wherein in the processing of the second film, the opening is formed to have a downward tapered shape in a cross section of the second film.

10. The method according to claim 7,
wherein in the processing of the first film, the first film is processed using the resist pattern as a mask.

11. The method according to claim 7,
wherein in the processing of the first film, gradual receding occurs to the resist pattern above the third film over processing time of the dry etching.

12. The method according to claim 7,
wherein in the forming of the third film, as the third film, a first layer and a second layer formed above the first layer are formed, the first layer and the second layer being formed from a same material, and
the second layer has a film density lower than a film density of the first layer.

13. The method according to claim 12,
wherein in the processing of the third film,
the second layer has an etching rate at least twice an etching rate of the first layer.

14. The method according to claim 7,
wherein the first film is a silicon oxide film,
the second film is an aluminum oxide film, and
the third film is a silicon nitride film.

15. A method of manufacturing an organic EL display device, the method comprising
forming, above the TFT substrate manufactured using the method according to claim 7, a light-emitting layer which emits light through recombination of an electron and a hole.

* * * * *